(12) United States Patent
Stapelbroek

(10) Patent No.: US 7,940,141 B2
(45) Date of Patent: May 10, 2011

(54) PWM SIGNAL GENERATION CIRCUIT, CLASS-D AMPLIFIER AND METHOD FOR DRIVING THE SAME

(75) Inventor: Willem Johan Stapelbroek, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 18 days.

(21) Appl. No.: 12/605,653

(22) Filed: Oct. 26, 2009

(65) Prior Publication Data

US 2010/0102883 A1 Apr. 29, 2010

(30) Foreign Application Priority Data

Oct. 28, 2008 (JP) ................................. 2008-277155

(51) Int. Cl.
H03K 7/00 (2006.01)
H03K 7/08 (2006.01)
(52) U.S. Cl. ....................................... 332/107; 332/109
(58) Field of Classification Search .................. 332/107, 332/109–111; 363/21.1, 41; 375/238, 296
See application file for complete search history.

(56) References Cited

U.S. PATENT DOCUMENTS

| 6,853,325 B2 | 2/2005 | Arizumi et al. |
| 6,987,418 B2 | 1/2006 | Kim et al. |
| 7,279,965 B2 * | 10/2007 | Hansen et al. ................. 330/10 |
| 2006/0262843 A1 | 11/2006 | Kim et al. |

FOREIGN PATENT DOCUMENTS

| JP | 2004-336765 | 11/2004 |
| JP | 2005-217583 | 8/2005 |
| JP | 2008-148288 | 6/2008 |
| JP | 2008-153999 | 7/2008 |
| JP | 2008-263519 | 10/2008 |
| JP | 2009-033430 | 2/2009 |

* cited by examiner

*Primary Examiner* — David Mis
(74) *Attorney, Agent, or Firm* — Morgan, Lewis & Bockius LLP

(57) ABSTRACT

A first situation indicating that the system is in a power-on situation or an un-mute situation, or a second situation indicating that the system is in a power-off situation or in a mute situation, is detected. When the first situation is detected, a differential PWM signal including a plurality of pulses each having a gradually increased or reduced width and the subsequent pulse train of 50% duty cycle pulses is generated and, if the output of an audio processor is in a stable situation, sent to the amplifier via a multiplexer. When the second situation is detected, the differential PWM signal including a plurality of pulses each having a gradually reduced width and the subsequent pulse train of no signal is generated and, at the same time, the generated pulses are sent to the amplifier via the multiplexer.

14 Claims, 29 Drawing Sheets

| PWMA | 1 | 0 | 1 | 0 |
|---|---|---|---|---|
| PWMB | 0 | 1 | 0 | 1 |
| REDUCED PULSE WIDTH (%) | 27.8 | 72.8 | 95.0 | 100 |

FIG.23A

| PWMA | 0 | 1 | 0 | 1 |
|---|---|---|---|---|
| PWMB | 1 | 0 | 1 | 0 |
| REDUCED PULSE WIDTH (%) | 27.8 | 72.8 | 95.0 | 100 |

FIG.23B

| PWMA | 1 | 0 | 1 | 0 |
|---|---|---|---|---|
| PWMB | 0 | 1 | 0 | 1 |
| AT 0 INPUT LEVEL (DUTY CYCLE OF 50%) | 100 | 100 | 100 | 100 |

PWM SIGNAL GENERATION CIRCUIT, CLASS-D AMPLIFIER AND METHOD FOR DRIVING THE SAME

CROSS-REFERENCE TO RELATED APPLICATIONS

This application claims the benefit of Japanese Patent Application No. 2008-277155 filed Oct. 28, 2008, which is hereby incorporated by reference herein in its entirety.

BACKGROUND OF THE INVENTION

1. Field of the Invention

The present invention relates to a circuit for generating two-level differential PWM signals to be output to a class-D amplifier, and also relates to a method and apparatus for reducing pop noise.

2. Description of the Related Art

Nowadays there is a trend that a lot of audio amplifiers will have the form of class-D amplifiers. The reason is that they have a very high efficiency. This means that they don't consume so much power and they don't produce so much heat as conventional amplifiers like class-AB amplifiers for the same output power. Therefore, the class-D amplifiers can be kept relatively small.

A class-D amplifier uses pulse width modulation. The amplifier uses pulse width modulation (PWM) to convert an analog audio signal or a digital PCM signal to a pulse signal that is a function of the amplitude of the analog audio signal or the value of the digital PCM signal. In case of an analog system, the pulse width modulated signal is generated by modulating an analog input signal with a higher frequency carrier or a modulation signal. This can be, for example, a symmetric or saw-tooth triangular wave. The pulse signal can be easily amplified by using switches.

At the output of the class-D system, the high frequency digital pulse signal is filtered by a low-pass filter so as to filter out the high frequency switching noise, and the amplified input signal is retrieved.

FIG. 1 shows two-level PWM signals when the audio input is '0'. These signals are applied to the output stage of the Class-D amplifier.

FIGS. 2A to 2C give some examples of the class-D amplifier: FIG. 2A shows a circuit of a half-bridge class-D amplifier having one power source; FIG. 2B shows a circuit of a half-bridge class-D amplifier having two power sources; and FIG. 2C shows a circuit of a full-bridge class-D amplifier having one power source. Here, in FIG. 2C, PWMA' is the inverted version of PWMA and PWMB' is the inverted version of PWMB, and M1 and M3 are PMOS transistors and M2 and M4 are NMOS transistors. Here, inductors L and capacitors C except for capacitor C2 in FIG. 2A act as high frequency removal filters.

The class-D amplifiers as shown in FIGS. 2A to 2C, in comparison with other types of amplifiers, due to their specific driving mode, generate a so-called pop-noise at on/off of the power or at on/off of muting. Here, the pop-noise is generally used for a term meaning an unintended sound or a noise that can be heard as "a plosive sound" from a speaker. In this document, it is defined as a noise generated from a speaker or an electric noise occurring in a drive signal of the speaker, which occurs at on/off of the power of the amplifier or at on/off of muting and is not contained in a signal source.

FIGS. 3A and 3B show an example of a pop-noise in exemplary circuits of FIGS. 2A to 2C, and a result of a conventional countermeasure against the pop-noise. FIG. 3A shows a case in which the pop-noise is superposed on a differential input signal of the class-D amplifier at the start of driving the amplifier when no countermeasure is taken, the top diagram of FIG. 3A shows a differential input signal denoted by a thin line and an integrated input signal denoted by a thick line, the middle diagram shows a $2^{nd}$ order integrated input signal denoted by a thick line, and the bottom diagram shows a filtered PWM signal denoted by a thin line (such as, a signal for driving a speaker itself) and an A-weight filtered signal of this speaker drive voltage denoted by a thick line.

FIG. 3B shows a case in which a pop-noise is superposed on a differential input signal of the class-D amplifier at start-up when one reduced-width pulse is incorporated as a pre-pulse, the top diagram shows an integrated input signal, the middle diagram shows a $2^{nd}$ order integrated input signal, and the bottom diagram shows an A-weight filtered speaker drive voltage, which is denoted by a thin line.

FIG. 3A shows that when the signals PWMA and PWMB are applied on the output stage, an overshoot appears on the speaker voltage (Vsp). This results in a so-called pop-noise that can be heard by a listener through the speaker. Such a signal that is proportional to the audibility of human-beings can be made visible by filtering the speaker voltage with an A-weight filter. When the signals PWMA and PWMB are removed from the output stage a similar phenomenon will occur. In order to remove this overshoot, in case of a two-level PWM system, conventionally, the width of the first pulse (a pre-pulse) has been reduced to one-half of the width of the next pulse (duty cycle of 50%) (for example, refer to Publication of Japanese patent Laid-Open No. 2004-336765). FIG. 3B shows that applying this reduced-width pre-pulse can significantly reduce the overshoot.

This figure shows that, in comparison with the level of an A-weight filtered Vsp, when Vsp of no countermeasure has a peak-to-peak value of about 0.4 V, by adding the above-described reduced-width pre-pulses, the Vsp will have a peak-to-peak value of about 0.015 V (about 1/27).

In addition, in the above-described case, in a situation before the signals PWMA and PWMB are applied on the output stage, in other words, in a situation where the signals PWMA and PWMB are not applied on the output stage, transistors shown in FIGS. 2A to 2C are driven to be in an off situation.

SUMMARY OF THE INVENTION

Although the overshoot at start-up is substantially reduced by adding the above-described reduced-width pre-pulses, there are problems that it is still present and in some cases, for example, in a case where an audio signal is in a silent situation, it is lightly audible. Therefore, it is desirable to reduce the overshoot even more.

The present invention is devised in view of such problems, and its object is to provide a method and apparatus, which generates PWM signals in order to still further reduce the pop-noise occurring when these signals are applied on or removed from an output stage.

In order to achieve the above-described object, an invention according claim 1 of the present invention is a PWM signal generation circuit for generating a differential PWM signal composed of a first and a second PWM signal to be output to a class-D amplifier, comprising: a pulse generator for outputting a differential PWM signal including a plurality of pulses each having a gradually increased or reduced width at power-on/power-off or at mute/un-mute, wherein the plurality of pulses each having a gradually increased width is alternately allocated to the first and second PWM signals in an ascending order of the widths, or the plurality of pulses each having a gradually reduced width is alternately allocated to the first and second PWM signals in an descending order of the widths.

Moreover, in the PWM signal generation circuit of the present invention, the ratios of widths of the plurality of pulses output from the pulse generator, each pulse having a gradually increased or reduced width except for the 50% duty cycle pulses may be calculated with the equations from Formula 1, Formula 2 and Formula 3:

$$eq_0 \Rightarrow T_i = T_{(i-1)} + \frac{T_{SW}}{2} \qquad \text{Formula 1}$$

For $j$ = odd  Formula 2

$$eq_j \Rightarrow \frac{T_i^j + 2\sum_{n=1}^{i-1}[(-1)^{(n+j)} \cdot (T_n - T_i)^j] + T_{i-1}^j + 2\sum_{n=1}^{i-2}[(-1)^{(n+j)} \cdot (T_n - T_{i-1})^j]}{j!} = 0$$

For $j$ = even $$eq_j \Rightarrow \frac{T_i^j + 2\sum_{n=1}^{i-1}[(-1)^{(n+j)} \cdot (T_n - T_i)^j]}{j!} = 0$$

$j = 1, 2, 3 \ldots$ $$R_{Wpi} = \frac{2(T_i - T_{i-1})}{T_{sw}} \qquad \text{Formula 3}$$

where,
when the width of the 50% duty cycle pulse is set to '1', $T_{sw}$ represents the period of the differential PWM signal: 'i' is a numerical value which is '0' at the first rising edge of a train of the gradually increased pulses, '1' at the next transition point, and '2' at the subsequent transition point; 'i−1' gives the number of reduced-width pulses; 'j' selects an equation for desired signal: if j=1 it gives a formula to calculate no offset in an integrated signal, j=2 it gives a formula to calculate no offset in a $2^{nd}$ order integrated signal, j=3 it gives a formula to calculate no offset in a $3^{rd}$ order integrated signal, and j=n it gives a formula to calculate no offset in an $n^{th}$ order integrated signal; and Rwpi (i=1, 2, . . . ) represents the ratio of each pulse width.

Moreover, in the PWM signal generation circuit of the present invention, the absolute value of a sum of widths of the plurality of pulses output from the pulse generator, each pulse having a gradually increased or reduced width except for the 50% duty cycle pulses, that is a sum of widths of pluses allocated to the first PWM signal and pluses allocated to the second PWM signal when the polarities of the both signals are inverted each other, is a half value of the width of a pulse train of the 50% duty cycle pulses.

Moreover, in the PWM signal generation circuit of the present invention, if the number of the plurality of pulses output from the pulse generator, each pulse having a gradually increased or reduced width except for the 50% duty cycle pulses, is two, the difference in pulse widths between the first pulse allocated to the first PWM signal and the second pulse allocated to the second PWM signal is one-half of the width of the pulse train of the 50% duty cycle pulses.

Moreover, in the PWM signal generation circuit of the present invention, the pulse generator outputs a differential PWM signal including the plurality of pulses each pulse having a gradually increased or reduced width and the subsequent pulse train of 50% duty cycle pulses, or outputs a differential PWM signal including the plurality of pulses each pulse having a gradually increased or reduced width and the subsequent no signal.

Moreover, the PWM signal generation circuit of the present invention comprises: a detection circuit for detecting that a differential PWM signal representing an audio input signal shows the same pulse train of 50% duty cycle pulses as the pulse train of 50% duty cycle pulses; and a multiplexer for receiving the differential PWM signal output from the pulse generator and the differential PWM signal representing the audio signal, and selecting one of the signals to output it to the class-D amplifier.

Moreover, the PWM signal generation circuit of the present invention comprises: a situation detection block for detecting a power-on/power-off situation or a mute/un-mute situation; and a control block for controlling the multiplexer and controlling generation of the differential PWM signal in the pulse generator, based on the output signals of the situation detection block and the detection circuit.

Moreover, in the PWM signal generation circuit of the present invention, the control block, when receiving an detection output of detecting a first situation indicating the power-on situation or the un-mute situation from the situation detection block, controls the pulse generator so as to generate a differential PWM signal including the plurality of pulses each pulse having a gradually increased or reduced width and the subsequent pulse train of 50% duty cycle pulses, and controls the multiplexer during outputting the pulse train of the 50% duty cycle pulses so as to switch the output of the multiplexer from the output of the pulse generator to the differential PWM signal representing the audio signal, based on the output of the detection circuit.

Moreover, in the PWM signal generation circuit of the present invention, the control block, when receiving an detection output of detecting a second situation indicating the power-ff situation or the mute situation from the situation detection block, controls the multiplexer so as to switch the output of the multiplexer from the differential PWM signal representing the audio signal to the output of the pulse generator, and controls the first pulse generator so as to generate a differential PWM signal including the plurality of pulses each pulse having a gradually increased or reduced width and the subsequent no signal.

In order to achieve the above-described object, the class-D amplifier according to claim 10 of the present invention comprises the PWM signal generation circuit according to any of the claims 1 to 9.

In order to achieve the above-described object, a method for driving the class-D amplifier according to claim 11 of the present invention, comprises the steps of: outputting a differential PWM signal including a plurality of pulses each pulse having a gradually increased or reduced width to the class-D amplifier at power-on/power-off or at mute/un-mute, the differential PWM signal having a first and a second PWM signal, and allocating the plurality of pulses each having a gradually increased width to the first and second PWM signals alternately in ascending order of the widths, or allocating the plurality of pulses each having a gradually reduced width to the first and second PWM signals alternately in descending order of the widths.

Moreover, in the driving method of the present invention, the ratios of widths of the plurality of pulses output from the pulse generator, each pulse having a gradually increased or reduced width except for the 50% duty cycle pulses can be calculated with the equations from Formula 1, Formula 2 and Formula 3:

$$eq_0 \Rightarrow T_i = T_{(i-1)} + \frac{T_{SW}}{2} \quad \text{Formula 1}$$

For $j$ = odd  Formula 2

$$eq_j \Rightarrow \frac{T_i^j + 2\sum_{n=1}^{i-1}[(-1)^{(n+j)} \cdot (T_n - T_i)^j] + T_{i-1}^j + 2\sum_{n=1}^{i-2}[(-1)^{(n+j)} \cdot (T_n - T_{i-1})^j]}{j!} = 0$$

For $j$ = even $$eq_j \Rightarrow \frac{T_i^j + 2\sum_{n=1}^{j-1}[(-1)^{(n+j)} \cdot (T_n - T_j)^j]}{j!} = 0$$

$j = 1, 2, 3 \ldots$ $$R_{Wpi} = \frac{2(T_i - T_{i-1})}{T_{sw}} \quad \text{Formula 3}$$

where, when the widths of the 50% duty cycle pulses are set to '1', $T_{sw}$ represents the period of the differential PWM signal; 'i' is a numerical value which is '0' at a first rising edge of the gradually increased pulse train, '1' at the next transition point, and '2' at the subsequent transition point; 'i−1' gives the number of reduced-width pulses; 'j' selects an equation for desired signal: if j=1 it gives a formula to calculate no offset in an integrated signal, j=2 it gives a formula to calculate no offset in a $2^{nd}$ order integrated signal, j=3 it gives a formula to calculate no offset in a $3^{rd}$ order integrated signal, and j=n it gives a formula to calculate no offset in an $n^{th}$ order integrated signal; and Rwpi (i=1, 2, . . . ) represents the ratio of each pulse width.

Moreover, in the driving method of the present invention, the absolute value of a sum of the widths of the plurality of pulses output from the pulse generator, each having a gradually increasing or decreasing width except for those of the 50% duty cycle pulses, that is a sum of the widths of the pulses allocated to the first PWM signal and the pulses allocated to the second PWM signal when the polarities of the both signals are inverted each other, may be one-half of the pulse width of the pulse train of the 50% duty cycle pulses.

Moreover, in the driving method of the present invention, if the number of the plurality of pulses output from the pulse generator, each pulse having a gradually increased or reduced width except for the 50% duty cycle pulses, is two, the difference in pulse widths between the first pulse allocated to the first PWM signal and the second pulse allocated to the second PWM signal is one-half of the width of the pulse train of the 50% duty cycle pulses.

As described above, according to the present invention, a pop-noise occurring when a PWM signal is applied on the output stage of the class-D amplifier or removed from the output stage, can be significantly reduced than in conventional examples.

Furthermore, by increasing the number of a plurality of reduced-width pulses, according to a higher demand level to a target amplifier, the level of the resultant pop-noise can be reduced to a substantially negligible level.

Further features of the present invention will become apparent from the following description of exemplary embodiments (with reference to the attached drawings).

BRIEF DESCRIPTION OF THE DRAWINGS

FIGS. 23A to 23C show an example of mutual relationship between a plurality of reduced-width pulses.

DESCRIPTION OF THE EMBODIMENTS

Hereinafter, with reference to drawings, embodiments of the present invention will be described. Although various types of pulse width modulation signals are present, in the present invention, only two-level differential PWM signals will be considered. Moreover, in the following description, although the case where a pop-noise becomes significant is in a silent situation, basically, it is assumed that start-up/shut-down or muting/un-muting is performed when the audio signal is not in a silent situation. However, even if it is not in a silent situation, if supposed that a pre-pulse or a post-pulse according to the present invention is inserted, a period that can be considered in a silent situation, in other words, a period in which both of PWMA and PWMB become in a state of 50% duty cycle for an order of several periods of a PWM signal, may be present.

Thus, cases including a case that can be considered as a silent situation thereby requires countermeasure against a pop-noise will be described below by considering the opposite cases. Moreover, hereinafter, reduced-width pre-pulses to be inserted which will be referred to as pre-pulses when they are inserted before duty 50% cycle pulses and as post-pulses when they are inserted after duty 50% cycle pulses, will be distinguished from signal pulses from an audio processor. In addition, post-pulses including the subsequent 50% duty cycle pulses are sometimes referred to as a post-pulse train.
(Consideration)

Figure 1:
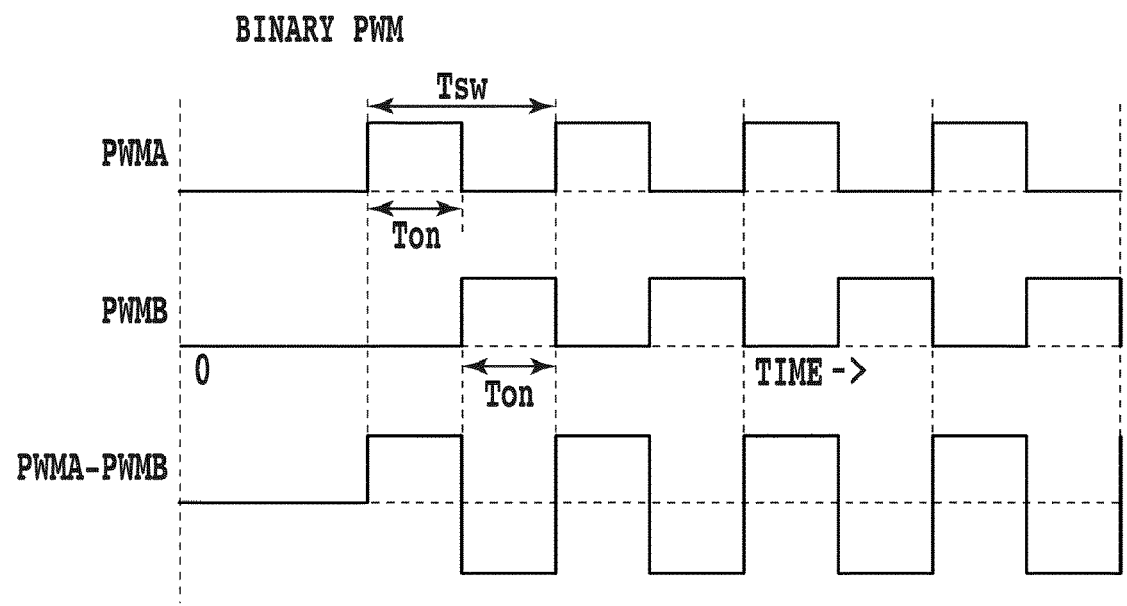
FIG. 1 shows waveforms of binary PWM signals.
Figure 2A:
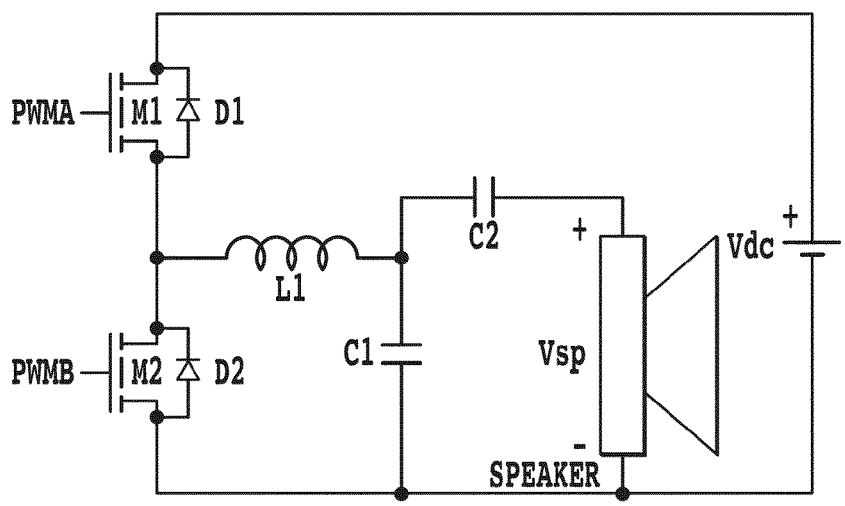
FIGS. 2A to 2C show some examples of class-D amplifier.
Figure 2B:
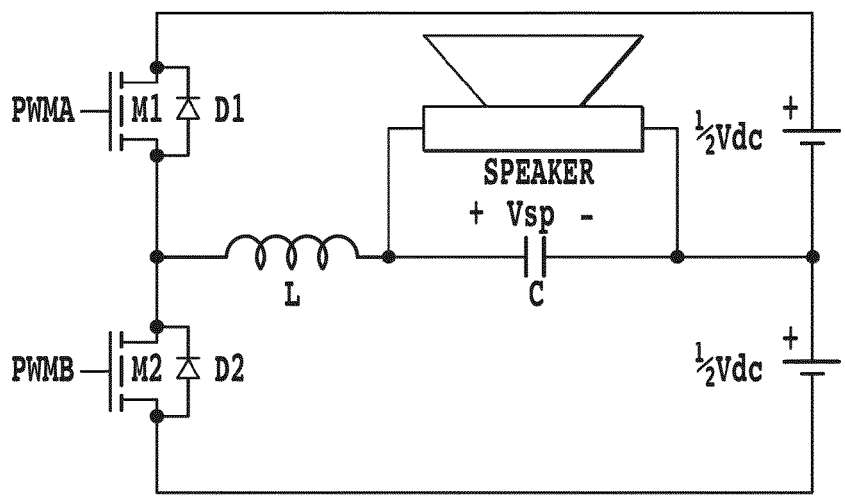
Figure 2C:
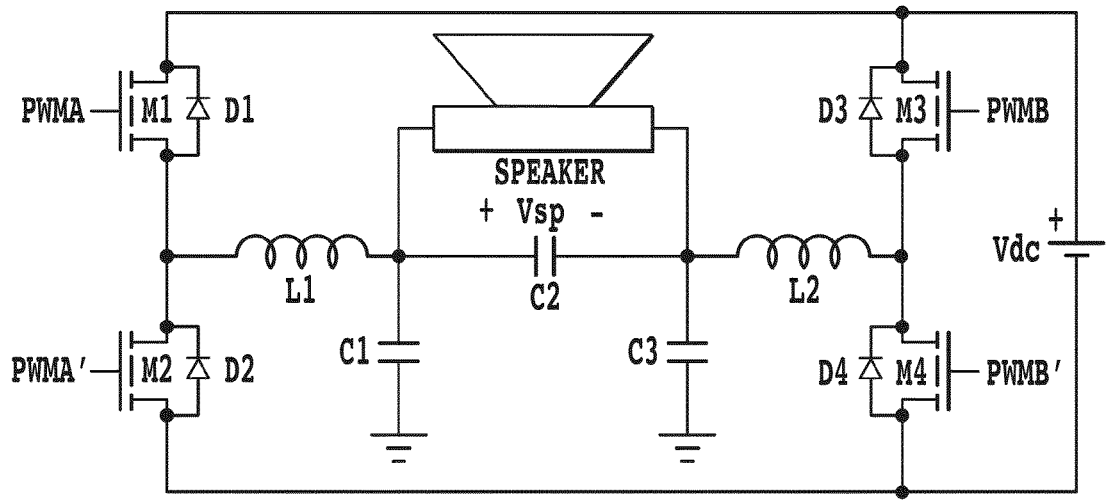

In the present invention, PWMA and PWMB, and also PWMA' and PWMB' in case of FIG. 2C (inverted-polarity versions of them) are used for application to a differential output stage.

Figure 3A:
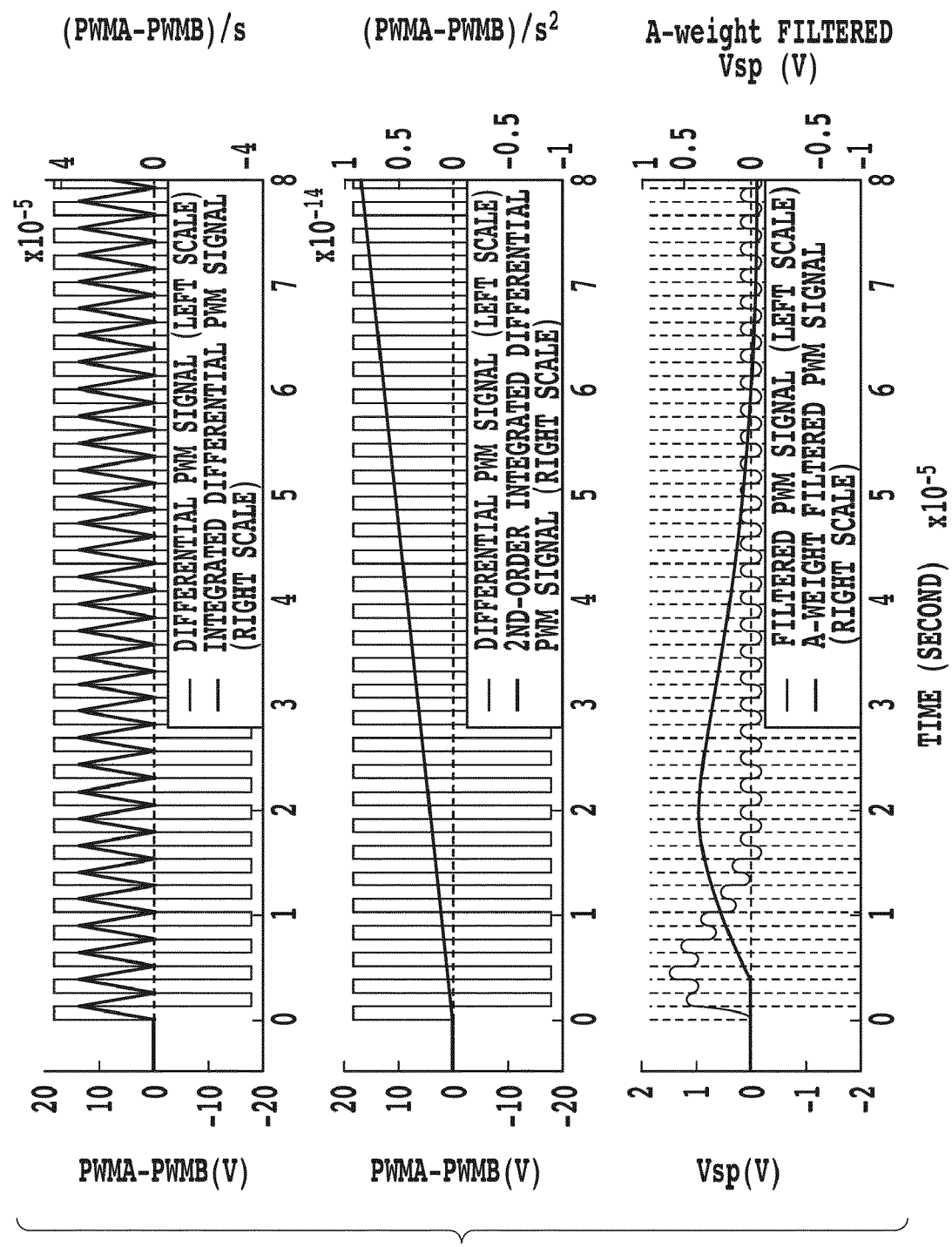
FIGS. 3A and 3B show signals in a conventional example.
Figure 3B:
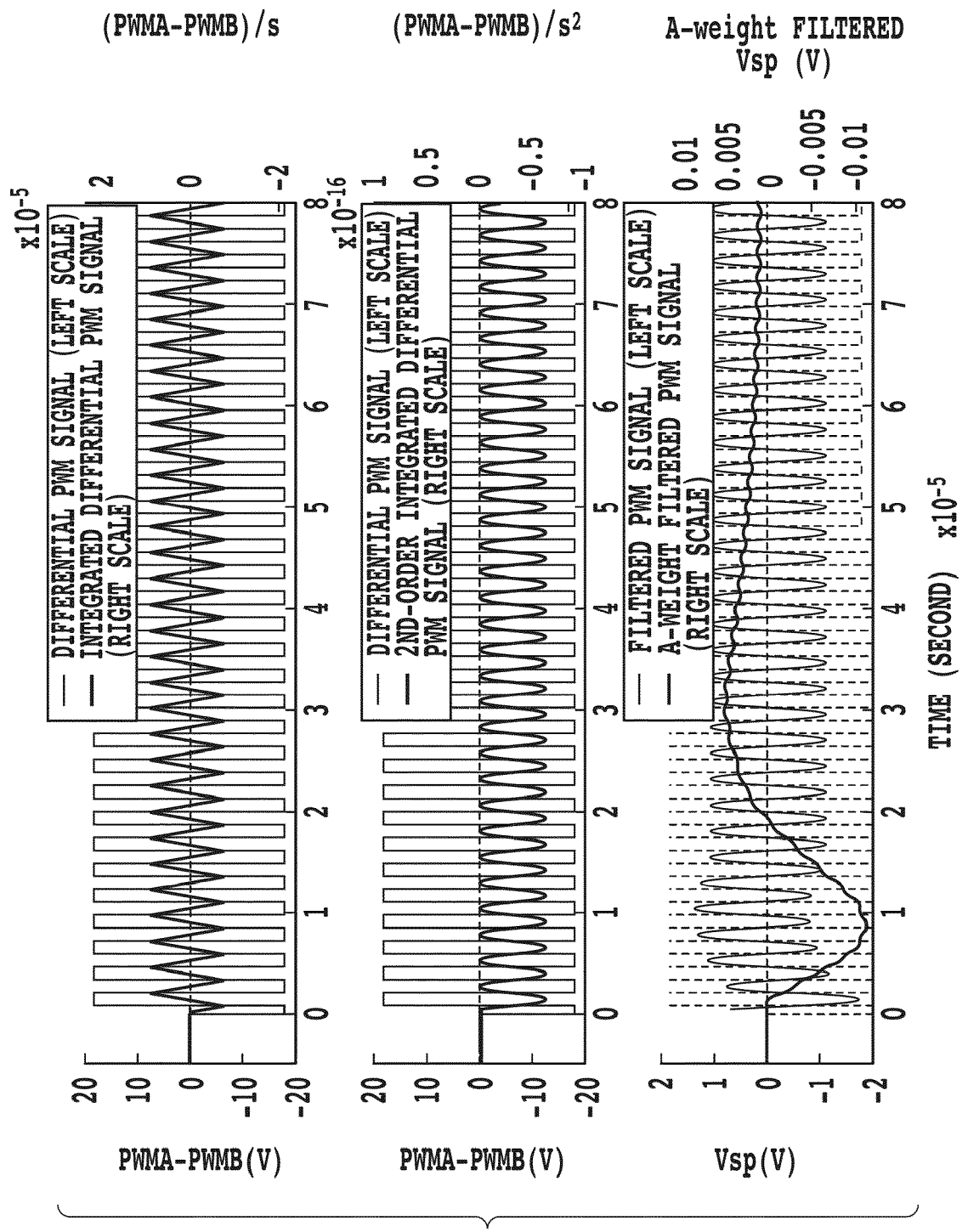

As understood from FIG. 3A, if there is no reduced-width pre-pulse, an integrated differential PWM (signal input) has an offset. Output filters (for example; L1 and C1 in FIG. 2A) will filter the offset, resulting in a large overshoot in a speaker drive voltage. As mentioned above, FIG. 3B shows that use of one reduced-width pre-pulse having one-half width of a normal pulse will remove the offset, thus, resulting in reduction of the overshoot of the speaker voltage. It is understood that the main overshoot of the speaker voltage will disappear by this. However, overshoot resulting from the first pulse still remains there, resulting in an lightly audible pop-noise. Even if the width of the reduced-width pre-pulse is reduced further, the overshoot cannot be removed.

The inventor of the present invention thought that, in order to solve the above-described problem, firstly an integrated signal should be stabilized (fluctuation should be eliminated), then, the offset should be minimized, and further found out that the solution is in a signal having higher order integrated signal power. It can be known that the integrated signal composed of a signal having width of one-half of the width of one reduced-width pre-pulse has an offset. It can be understood that, if the offset is minimized so as to stabilize the signal, the overshoot of the speaker drive voltage will reduce more. The final conclusion on the study for the above-described problems is that if the offset is reduced in a higher order integrated signal and the signal is stable (the fluctuation of the signal is eliminated), the overshoot of the speaker voltage will be smaller.

This is summarized as follows: in case of only minimizing the offset from the integrated signal, it is sufficient to use one reduced-width pre-pulse; for minimizing the offset from a $2^{nd}$-order integrated signal, it is necessary to use two reduced-width pre-pulses; and for minimizing the offset from a $3^{rd}$-order integrated signal, it is necessary to use three reduced-width pre-pulses.

The optimum solution of the above mentioned countermeasure can be exactly calculated by the following generalized formulas:

$$eq_0 \Rightarrow T_i = T_{(i-1)} + \frac{T_{sw}}{2} \quad \text{Formula 1}$$

For $j$ = odd  Formula 2

$$eq_j \Rightarrow \frac{T_i^j + 2\sum_{n=1}^{i-1}[(-1)^{(n+j)} \cdot (T_n - T_i)^j] + T_{i-1}^j + 2\sum_{n=1}^{i-2}[(-1)^{(n+j)} \cdot (T_n - T_{i-1})^j]}{j!} = 0$$

For $j$ = even $$eq_j \Rightarrow \frac{T_i^j + 2\sum_{n=1}^{i-1}[(-1)^{(n+j)} \cdot (T_n - T_i)^j]}{j!} = 0$$

$j = 1, 2, 3 \ldots$ $$R_{Wpi} = \frac{2(T_i - T_{i-1})}{T_{sw}} \quad \text{Formula 3}$$

In the above-described Formulas 1 to 3, the time points (time) Ti are equivalent to examples of those in FIGS. 4A to 4D.

FIGS. 4A to 4D show a situation where the offset until the $3^{rd}$ order integrated signal is minimized, if more reduced-width pre-pulses are used, more time points are necessary to calculate. The last two time points ($T_3$ and $T_4$ of three pre-pulses in FIG. 4) make the first signal pulse.

In formula 1, the formula ($eq_0$) represents the relationship between a time point $T_i$ and a time point $T_{i-1}$ of a non-integrated differential PWM signal. Here, $T_{sw}$ is the width of a pulse cycle.

In EQ 1, 'i' denotes the indication number of a time point, and thereby, 'i–1' gives the number of reduced-width pre-pulses. 'j' selects an equation for a desired signal. In Formula 2, if j=1, it gives a formula for calculating no offset in a $1^{st}$ order integrated signal; if j=2, it gives a formula for calculating no offset in a $2^{nd}$ order integrated signal; and if j=3, it gives a formula for calculating no offset in a $3^{rd}$ order integrated signal.

Figure 4A:
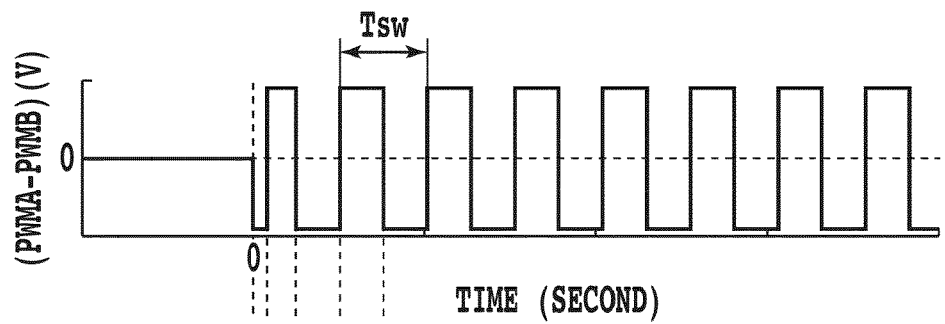
FIGS. 4A to 4D show signals of the present invention.
Figure 4B:
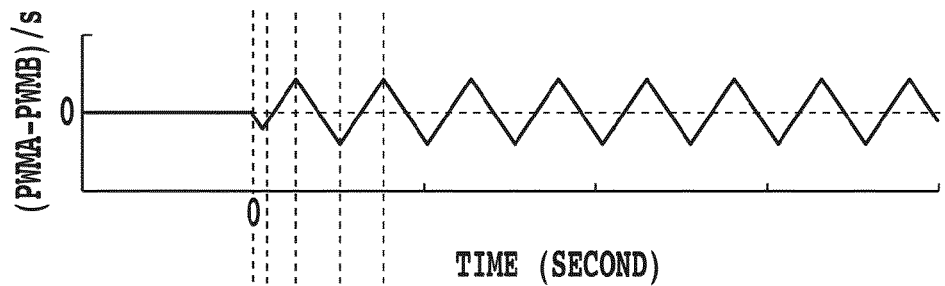
Figure 4C:
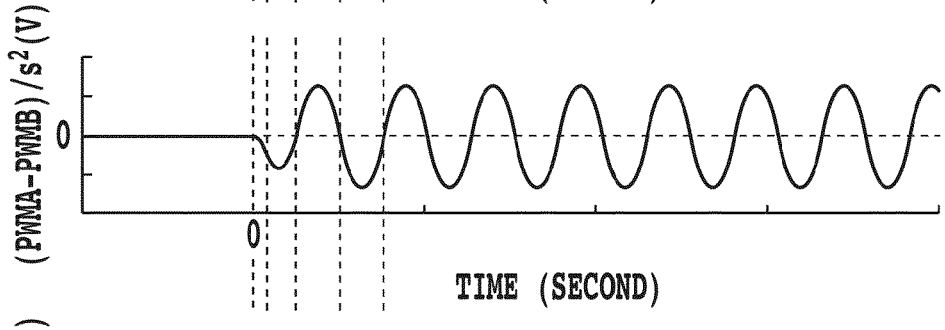
Figure 4D:
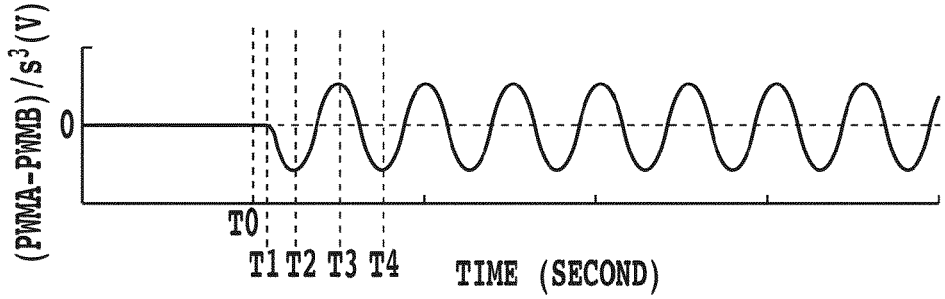

FIG. 4A shows a non-integrated differential PWM signal; FIG. 4B shows a $1^{st}$ order integrated signal; FIG. 4B shows a $2^{nd}$ order integrated signal; and FIG. 4D shows a $3^{rd}$ order integrated signal.

Actual widths of a plurality of pulses depend on the width $T_{sw}$ of a pulse cycle, thus, in Formula 3, ratios $R_{Wpi}$ of widths of pulses are calculated in connection with the pulse width of the first signal (the pulse width of the signal is 100%). When the width of $T_{sw}$ is changed, the actual width of the pre-pulses can be easily calculated by these ratios.

An idea behind Formulas 1 to 3 is to perform calculation at time points at which a PWM signal have to be changed so as to prevent an offset from occurring in the integrated signal. Firstly, the first signal pulse has to have a duty cycle of 50%. This results in Formula 1.

Important time points are the changing points of the first signal pulse that are $T_3$ and $T_4$ in FIGS. 4A to 4D having three pre-pulses. In order to have no offset to integrated signals, it is necessary for the values of $T_3$ and $T_4$ of the signals to be inverted each other for all cases. For example, in FIGS. 4A to 4D, the following formulas have to be satisfied:

$eq_0(T_3) = -eq_0(T_4)$;

$eq_1(T_3) = -eq_1(T_4)$;

$eq_2(T_3) = -eq_2(T_4)$; and $eq_3(T_3) = -eq_3(T_4)$.

Since integration gives 90° phase-shift to a signal, even-order integrated signal should be zero at these time points. For example, in FIG. 4C, $eq_2(T_3) = -eq_2(T_4) = 0$. This is the reason why Formula 2 separates for even-order integrated signals and odd-order integrated signals. All the time points can be calculated, and the optimum ratio between a plurality of reduced-width pulses can be calculated using the width of the pulse cycle ($T_{sw}$). This is expressed by Formula 3.

Here, for the optimum ratios of the reduced-width pre-pulses, if it is necessary to calculate the optimum ratio in case of only one reduced-width pre-pulse, 'i'=2, and $eq_0$ (differential PWM signal) and $eq_1$ (integrated signal) have to be solved by obtaining $T_1$ and $T_2$ (or $R_{Wp1}$).

In case of two reduced-width pulses, 'i'=3, thus, $eq_0$ (differential PWM signal), $eq_1$ (integrated signal) and $eq_2$ ($2^{nd}$-order integrated signal) have to be solved by obtaining $T_1$, $T_2$ and $T_3$ (or $R_{Wp1}$ and $R_{Wp2}$). When two reduced-width pre-pulses (i=3, j=2) are desired, calculating the pulse ratios using EQ 1 results in as follows:

Optimum pulse ratios in case of two pre-pulses become as follows:

$$\begin{cases} R_{Wp1} = \dfrac{2(T_1 - 0)}{T_{sw}} = \dfrac{1}{\sqrt{8}} \approx 35.4\% \\ R_{Wp2} = \dfrac{2(T_2 - T_1)}{T_{sw}} = \dfrac{2 + \sqrt{8}}{2\sqrt{8}} \approx 85.4\% \\ R_{Wp3} = \dfrac{2(T_3 - T_2)}{T_{sw}} = 100\% \; (= 1^{st} \text{ signal pulse}) \end{cases} \quad \text{Formula 4}$$

Figure 5A:
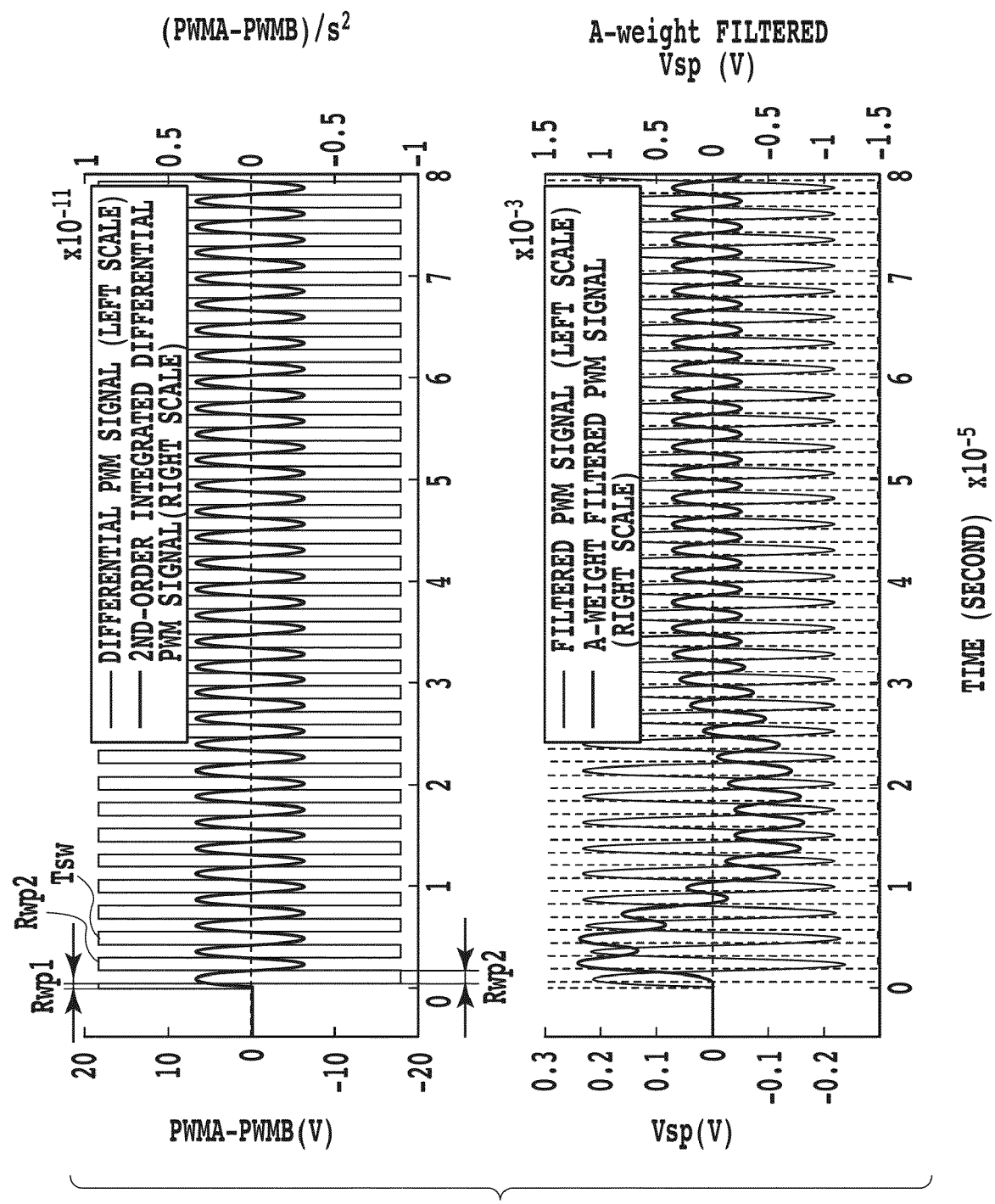
FIGS. 5A and 5B show signals of the present invention.

These ratios are used in FIG. 5A, which shows the results of the overshoot on the speaker voltage Vsp when the two reduced-width pre-pulses calculated above are used.

In order to generate a flat and small overshoot, the same calculation can be performed for three pre-pulses. For this it is necessary to solve four equations ($eq_0$, $eq_1$, $eq_2$ and $eq_3$). By solving these equations, the following pulse width ratios are derived. Optimum ratios for the three reduced-width pre-pulses (i=4, j=3) are as follows:

$$\begin{cases} R_{Wp1} = \dfrac{2(T_1 - 0)}{T_{sw}} = \dfrac{\sqrt{\sqrt{5} - 1}}{4} \approx 27.8\% \\ R_{Wp2} = \dfrac{2(T_2 - T_1)}{T_{sw}} = \dfrac{\sqrt{\sqrt{5} - 1} + \sqrt{\sqrt{5} + 1}}{4} \approx 72.8\% \\ R_{Wp3} = \dfrac{2(T_3 - T_2)}{T_{sw}} = \dfrac{2 + \sqrt{\sqrt{5} + 1}}{4} \approx 95.0\% \\ R_{Wp4} = \dfrac{2(T_4 - T_3)}{T_{sw}} = 100\% \; (= 1^{st} \text{ signal pulse}) \end{cases} \quad \text{Formula 5}$$

Figure 5B:
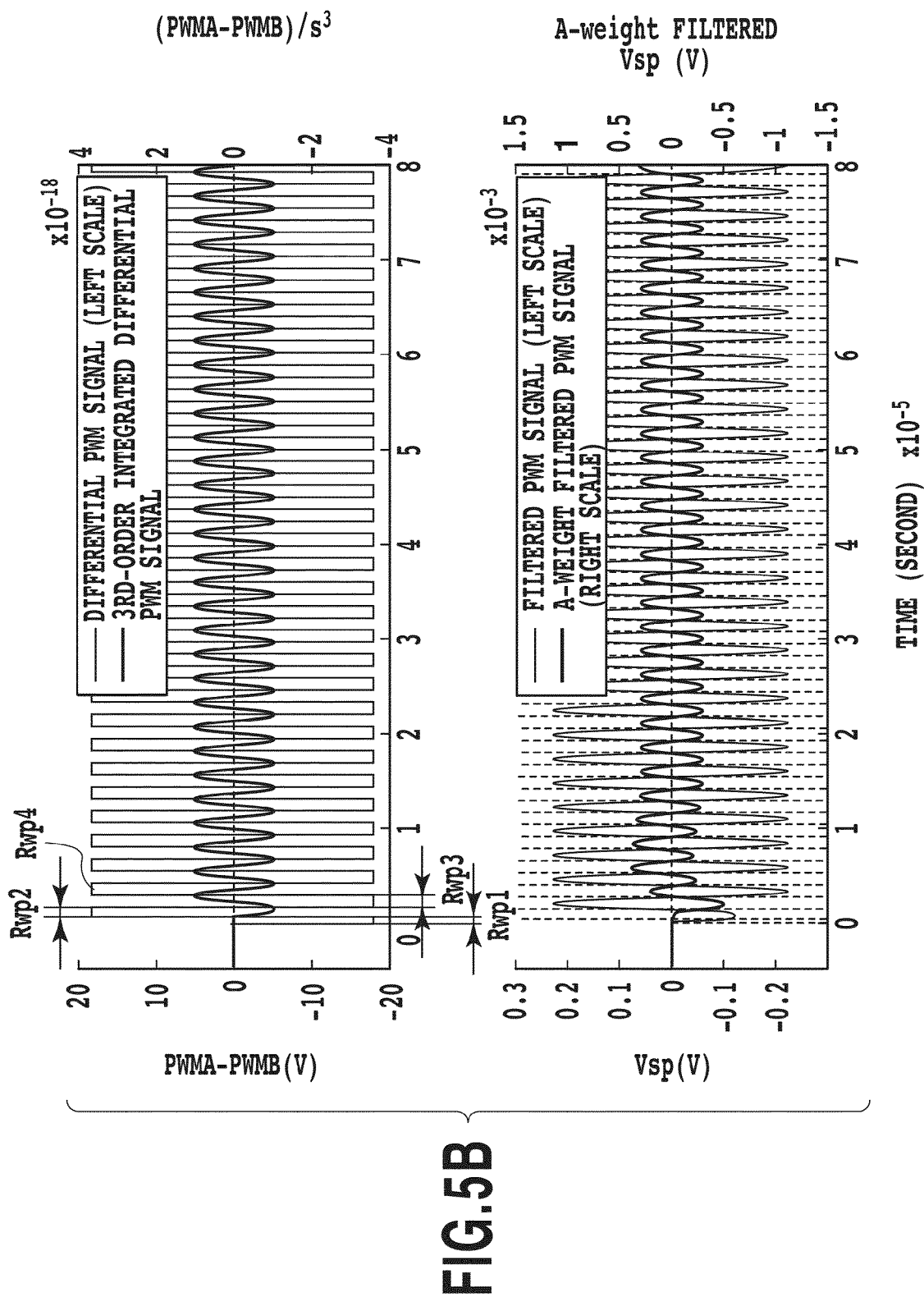

These ratios are used in FIG. 5B, which shows the result of the overshoot on the speaker voltage Vsp when the three reduced-width pre-pulses calculated above are used.

As understood, as the number of reduced-width pulses is increased, the overshoot will be smaller.

These calculations can be performed for all numbers of the reduced-width pre-pulses. Of course, it has to be said that the calculated values for the pulse widths are optimum. Although, deviation from the values results in a larger overshoot, of course, the overshoot will be still much less than a case of using no reduced-width pulse.

Moreover, when additional small pulses are used before pulses having optimum ratios calculated from Formulas 1 to 3, as long as the offset in the integrated signals stays minimum, the overshoot will approach to substantially the same one in case of using no additional pulse.

Figure 6A:
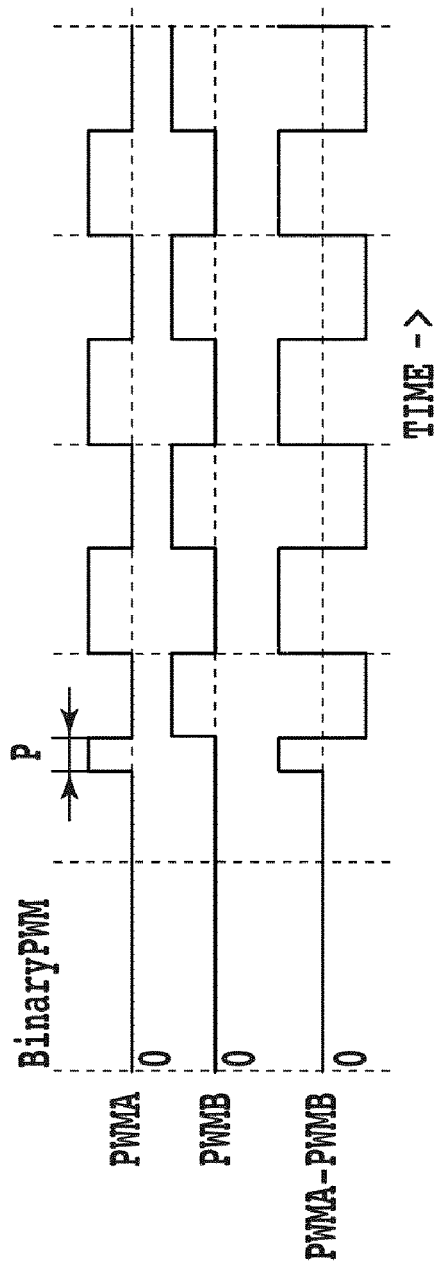
FIGS. 6A and 6B illustrate a deviation in pulse widths of reduced-width pulses.
Figure 6B:
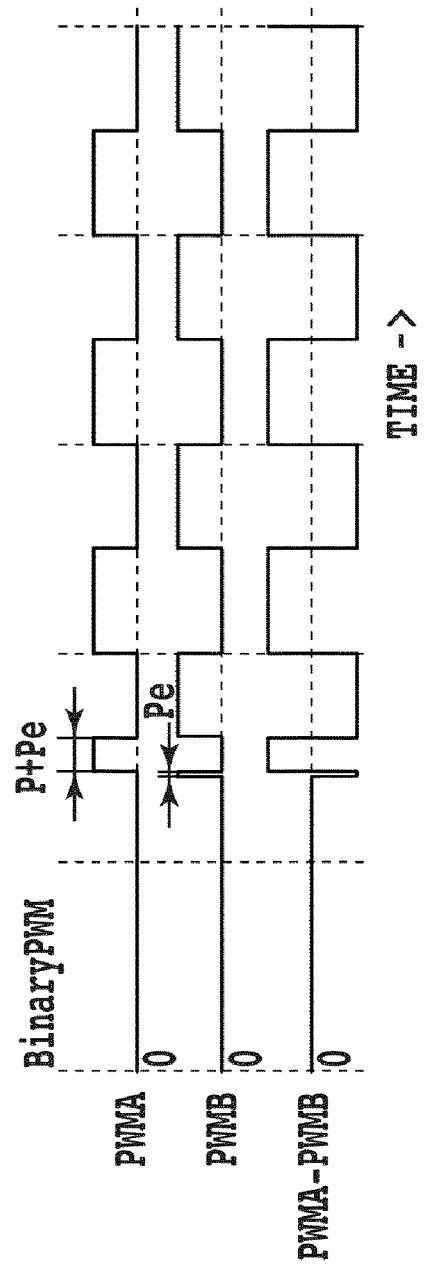

FIGS. 6A and 6B show this case. FIG. 6A shows the start-up wave form of an optimum anti pop-noise in a case of using two pre-pulses. FIG. 6B shows the start-up waveform of an anti pop-noise including a very small extra pre-pulse, in a situation deviated from FIG. 6A.

Here, in FIG. 6A, $R_{Wp1}$ of a pre-pulse of PWMA is 35%, for example, and $R_{Wp2}$ of a pre-pulse of PWMB is 85%, for example, thus it is understood that the value obtained by subtracting $R_{Wp1}$ of the pre-pulse of PWMA from $R_{Wp2}$ of the pre-pulse of PWMB is one-half of $R_{Wp3}$ of the pulse cycle next to the pre-pulses. Moreover, in the above-described case of three pre-pulses, pulse widths of each pulse are 27.8%, 72.8% and 95.0% in this order. If these pulses have different polarity in this order, the sum of widths of the pre-pulses becomes to 50 (=27.8−72.8+95), or −50 (=−27.8+72.8−95). That is, the sum of widths of pre-pulses each having polarity becomes 50%. Since 100% in this case is the sum of the pulse widths of 50% duty cycles, it can be said that the sum of widths of pre-pulses each having polarity becomes one-half of that of the widths of 50% duty cycles. In a case of the above-described two re-pulses, since 35−85=−50 (or, −35+85=50), the same relationship can be satisfied. In a case of four or more pre-pulses, the sum of the widths of pre-pulses each having polarity will be 50%.

As understood from the figures, as the number of reduced-width pre-pulses according to the present invention increases the overshoot will be smaller. For example, in a case of using two reduced-width pre-pulses, the A weight filtered $V_{sp}$ shows a peak-to-peak value of about 0.0028 V, and in a case of using three reduced-width pre-pulses, the A weight filtered $V_{sp}$ shows a peak-to-peak value of about 0.0006 V. However, it is understood that in the A weight filtered $V_{sp}$ of FIGS. 5A and 5B, in spite of removal of a high frequency removal filter, signals of fundamental frequency components of PWM remain, and pop-noises are reduced to the level of the signals.

As shown in FIGS. 5A and 5B, in a countermeasure to reduce pop-noises according to the present invention, it is obvious that the values for the widths of the pulses are optimum. Although deviation of the values results in a larger overshoot, of course the overshoot will be much smaller than that of a case using no reduced-width pulse. Moreover, an approach of using an additional pulse before the pulses having optimum ratios calculated from Formulas 1 to 3 mentioned-above, as long as the offset in the integrated signals stays minimum, the overshoot will approach to substantially the same one in case of using no additional pulse.

Peak-to-peak values of the A-weight filtered $V_{sp}$ in the above-described examples are summarized as follows.

TABLE 1

| Number of reduced-width pulses | A-weighted peak-to-peak value (mV) of Vsp to 18 V PWM |
|---|---|
| zero (no countermeasure) | about 388.5 |
| one (50% pulses) | about 11.5 |
| two reduced-width pulses according to the present invention | about 2.8 (substantially about 1.25) |
| three reduced-width pulses according to the present invention | about 0.5 |

In the above-described description, a case of applying a PWM signal is described. On the contrary, in cases where applying the PWM signal is stopped and a system including PWM is shut-down (at power-off), the same pop-noise will occur unless any countermeasure is taken. The reason is the same as that of a case of applying a signal. Fluctuation in offsets of the integrated signals affects largely on the pop-noise. The same reduced-width pre-pulses can also be adapted to a case of shut-down. In comparison with start-up pulses, pulses for shut-down are necessary to be in inverted order. This means that when the PWM signal is stopped, firstly a post-pulse having a largest reduced-width ($R_{Wpi}$) is required to be applied. Next, post-pulses each having more reduced width ($R_{Wp(i-1)}, \ldots R_{wp1}$) are required to be applied. The same equations in Formulas 1 to 3 can be used for calculating optimum ratios.

Figure 7A:
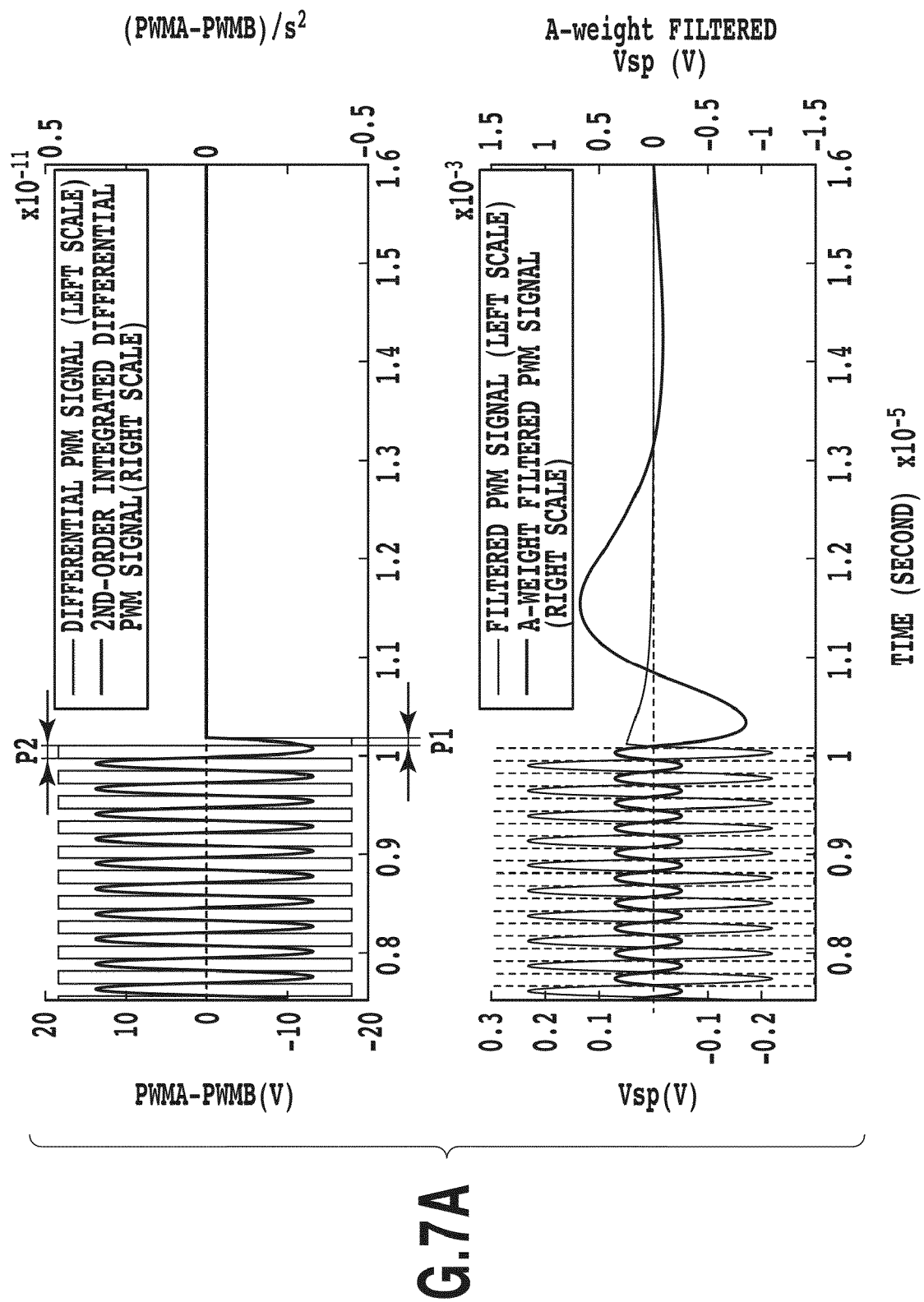
FIGS. 7A and 7B show a plurality of waveforms at shut-down.
Figure 7B:
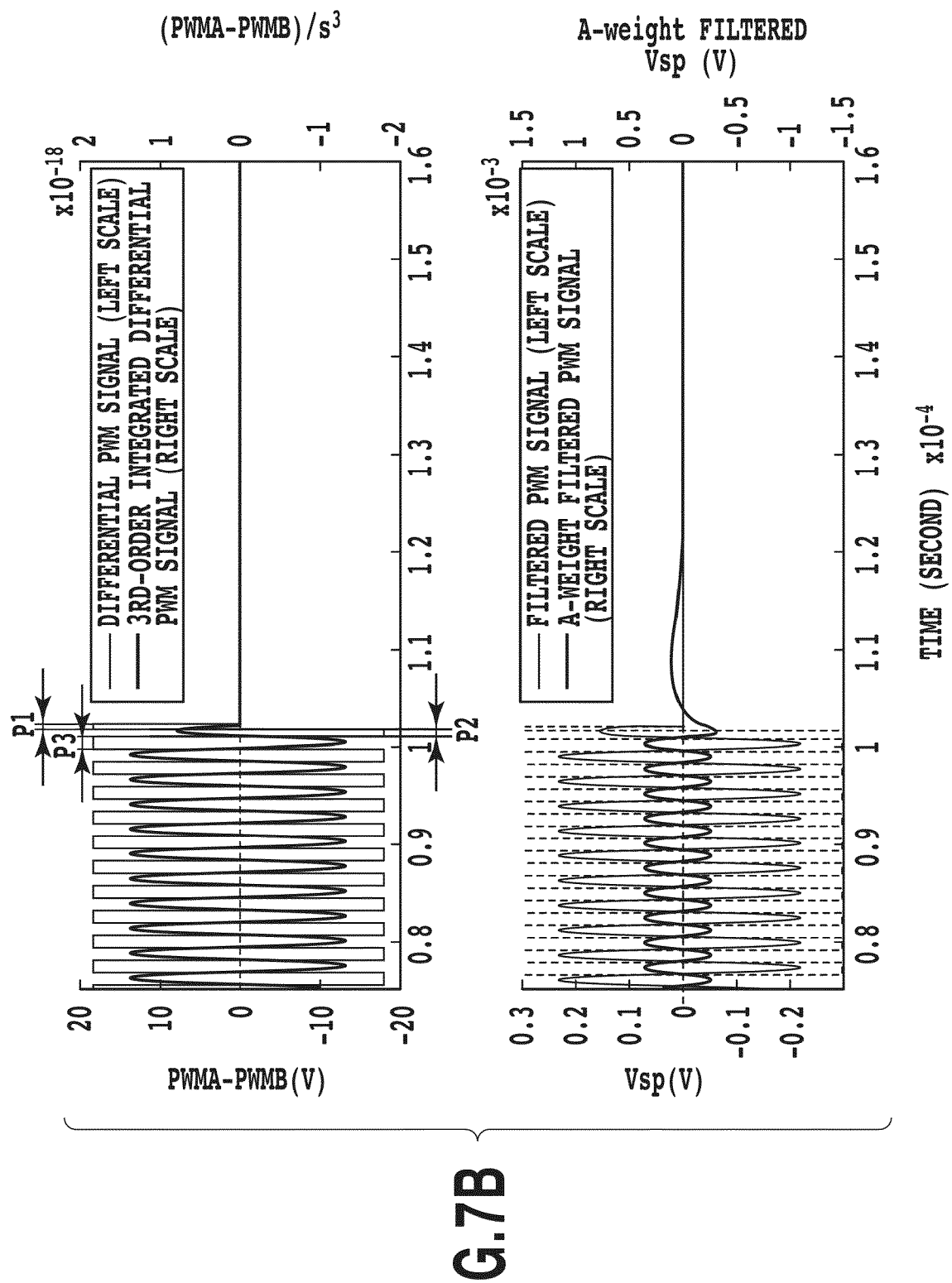

FIGS. 7A and 7B show a plurality of waveforms when the system is shut-down (at power-off), the PMW signal counteracts the overshoot of the speaker voltage using two or three reduced-width pre-pulses. The upper diagram of FIG. 7A shows the differential input signal of the class-D amplifier and the $2^{nd}$ order integrated input signal at shut-down when two reduced-width pre-pulses are incorporated; and the lower diagram of FIG. 7A shows the A-weight filtered speaker drive voltage at shut-down when two reduced-width pre-pulses are incorporated.

The upper diagram of FIG. 7B shows the differential input signal of the class-D amplifier and the $2^{nd}$ order integrated input signal at shut-down when three reduced-width pre-pulses are incorporated; and the lower diagram of FIG. 7B shows the A-weight filtered speaker drive voltage.

The present invention is valid for the use of the differential PWM signal pair (PWMA and PWMB). In the analysis it is shown that the differential signal is important for reducing the pop-noise. Compared to the actual waveforms of individual signals (e.g.; PWMA and PWMB), the differential signal of them (PWMA–PWMB) is more important.

Figure 8A:
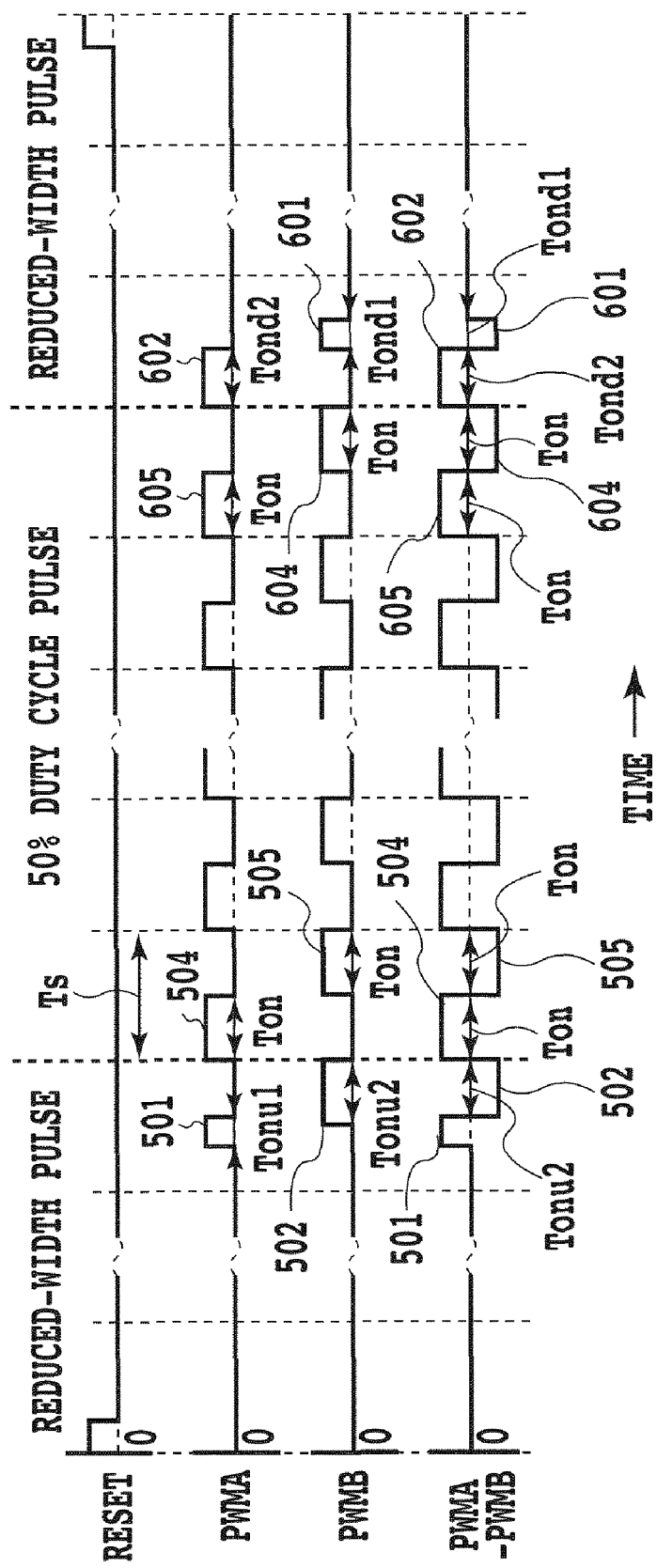
FIGS. 8A to 8C show differential PWMA and PWMB waveforms to generate the same differential signal.
Figure 8B:
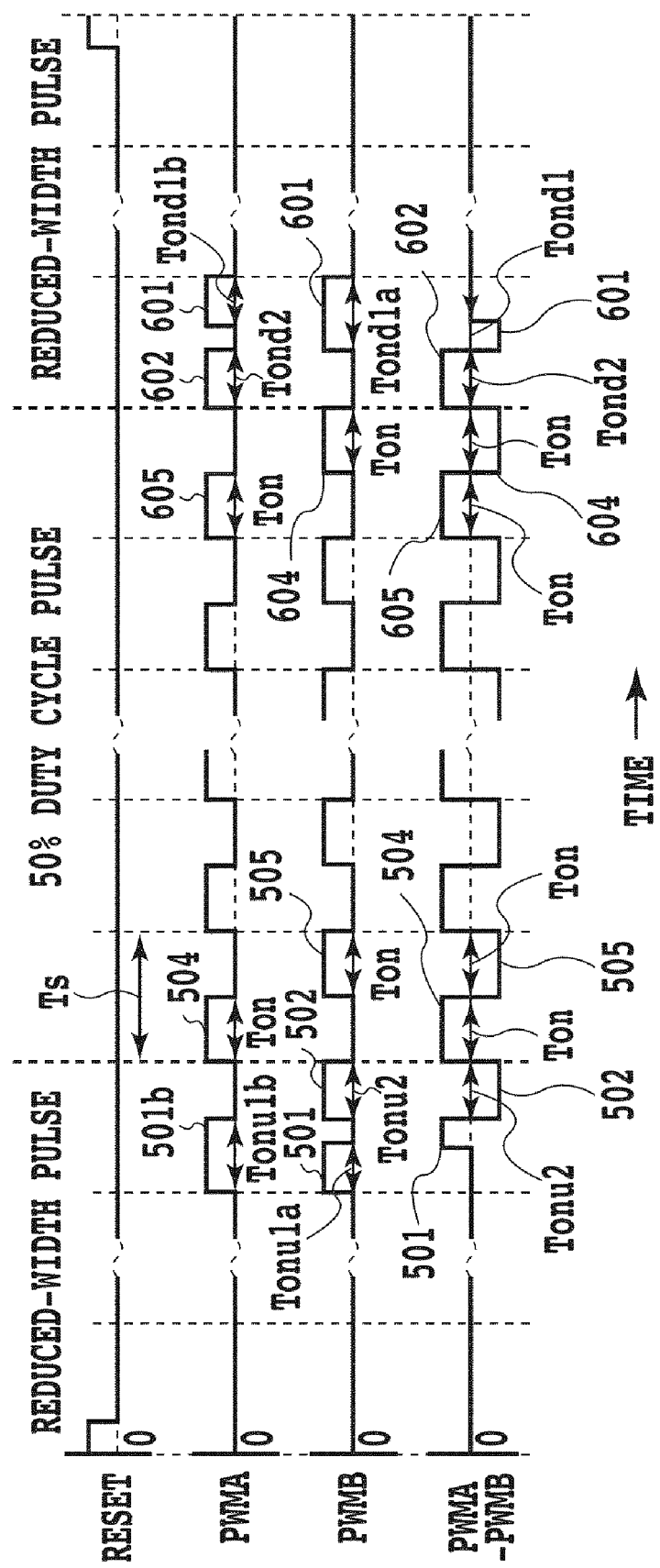
Figure 8C:
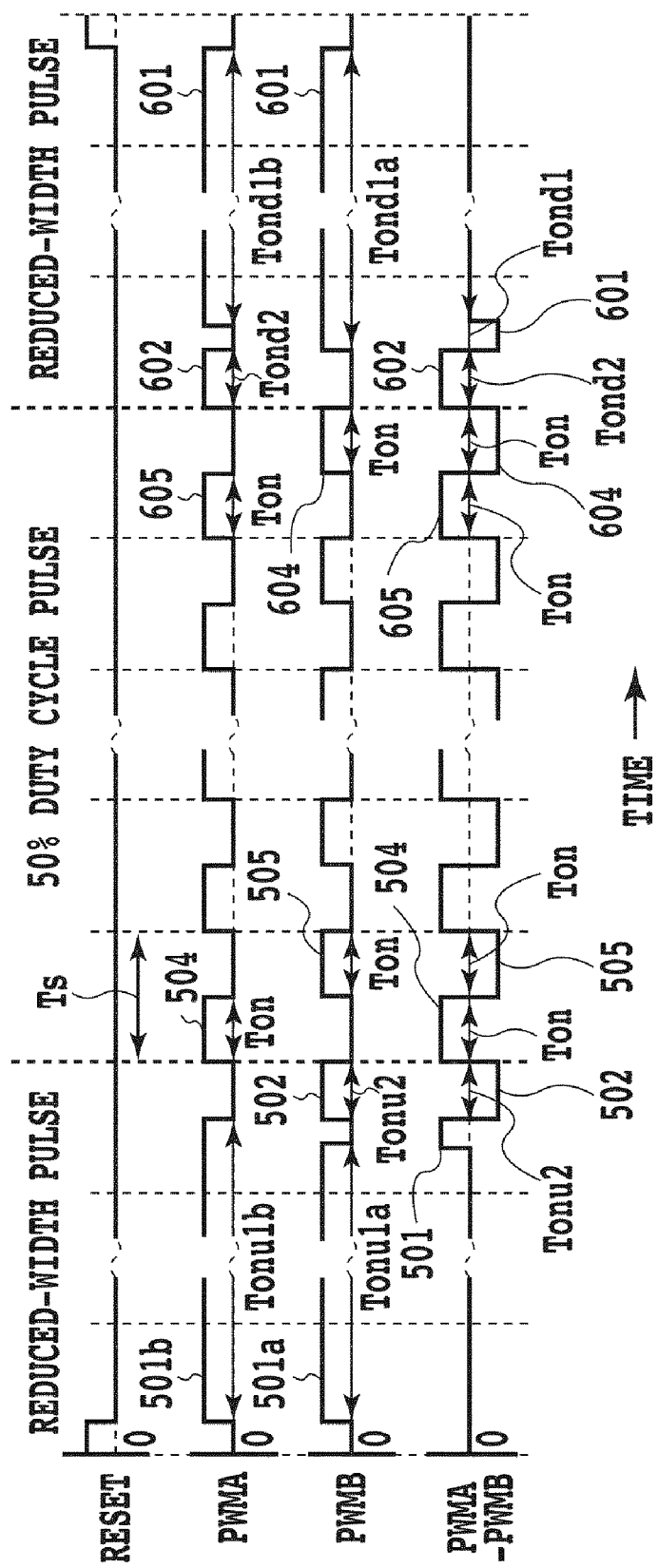

FIGS. 8A to 8C show individual waveforms for PWMA and PWMB that generate the same differential signal (PWMA–PWMB). FIG. 8A can be applied to all cases of FIGS. 2A to 2C, here, for waveforms PWMA and PWMB, the upper side indicates an H level and the lower side indicates an L level, and for waveform of (PWMA–PWMB), the middle portion indicates that the differential signal is zero. FIGS. 8B and 8C can be applied to an output stage having the configuration shown in FIG. 2C. In FIG. 8B, it is indicated that temporally overlapped portion of the width of PWMA Tonu1b and the width of PWMB Tonu1a does not exist as a differential signal because in the portion both signals are the same signal. In FIG. 8C, temporally overlapped portion between 501a and 501b, also does not exist as the differential signal because in the portion both signals are the same signal. Another point depends on which signal (PWMA or PWMB) has the first reduced-width pre-pulse, and which signal (PWMA or PWMB) has the first pulse from an audio signal.

Cases of an even number of reduced-width pulses include a case where PWMA has the first pulse from the audio signal, PWMA also has the first reduced-width pre-pulse and PWMB has the second reduced-width pre-pulse, etc., and a case where PWMB has the first pulse from the audio signal, PWMB also has the first reduced-width pre-pulse and PWMA has the second reduced-width pre-pulse, etc.

Furthermore, cases of an odd number of reduced-width pre-pulses include a case where PWMA has the first pulse from the audio signal, PWMB has the first pre-pulse and third reduced-width pre-pulses and PWMA has the second reduced-width pre-pulse, etc., and a case where PWMB has the first pulse from the audio signal, PWMA has the first and third reduced-width pre-pulses and PWMB has the second reduced-width pre-pulse, etc.

DETAILED DESCRIPTION OF PREFERRED EMBODIMENTS

Hereinafter, preferred embodiments of the invention will be described in detail.

Figure 9:
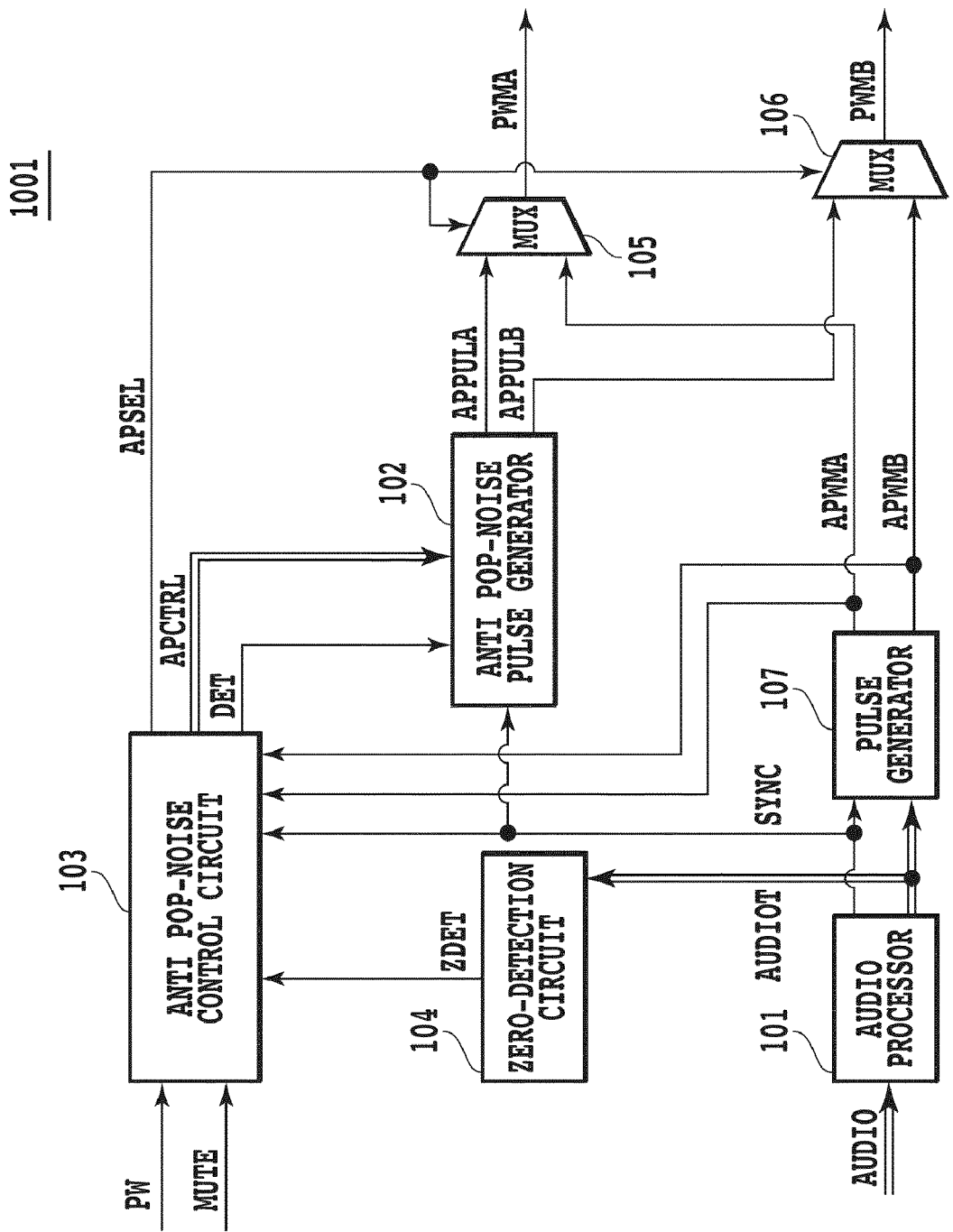
FIG. 9 shows a block diagram of a pre-stage of a class-D amplifier according to an embodiment of the present invention.

FIG. 9 gives the general block diagram of a differential PWM signal generation circuit 1001 of the preferred embodiments of the present invention, showing a part for receiving an audio signal AUDIO generated from an analog format or digital format audio signal to supply a differential PWM signal PWMA, PWMB to the above-described class-D amplifier.

An audio processor 101 and a pulse generator 107 convert the audio signal AUDIO into a differential PWM signal APWMA, APWMB. The audio processor 101, by receiving the audio signal AUDIO, outputs a signal AUDIOT to the pulse generator 107 and a zero-detection circuit 104 and outputs a signal SYNC to the pulse generator 107, an anti pop-noise pulse generator 102 and an anti pop-noise control circuit 103. Here, the signal SYNC is a signal for synchronizing the anti pop-noise pulse signals APPULA and APPULB with the audio signal AUDIO.

The zero-detection circuit 104 receives the signal AUDIOT from the audio processor 101, detects a case where the audio PWM signal is a stable input signal, and outputs a signal ZDET. This is because the plurality of reduced-width pulses for reducing the pop-noise assumes application or blocking of the differential PWM signal composed of a pulse train of 50% duty cycle pulses, and thus time points satisfying such situations are detected. Based on the detection results, a transition from the reduced-width pulses signal to the audio PWM signal and visa versa will be carried out.

The anti pop-noise control circuit 103 detects a change of the power (PW) bit signal or mute bit signal. More specifically, these signals are a status bit for on/off control of the power and a status bit for mute control, respectively. That is, based on the signals, actual on/off control of the power and mute control will be carried out. The anti pop-noise control circuit 103 also receives a signal SYNC from the audio processor 101 and a differential PWM signal APWMA, APWMB from the pulse generator 107, and finally controls the anti pop-noise pulse generator 102 so as to control the multiplexers 105 and 106 for selecting reduced-width pulse signals APPULA and APPULB and an audio differential PWM signal APWMA, APWMB.

Although it is not clear in the figure, in an initial setting at power on of a system including an amplifier, multiplexers 105 and 106 are set by the anti pop-noise control circuit 103 so as to output the output of the anti pop-noise pulse generator 102 to the amplifier.

The anti pop-noise pulse generator 102 is controlled by the anti pop-noise control circuit 103 so as to generate the reduced-width pulse signals APPULA and APPULB.

Figure 10A:
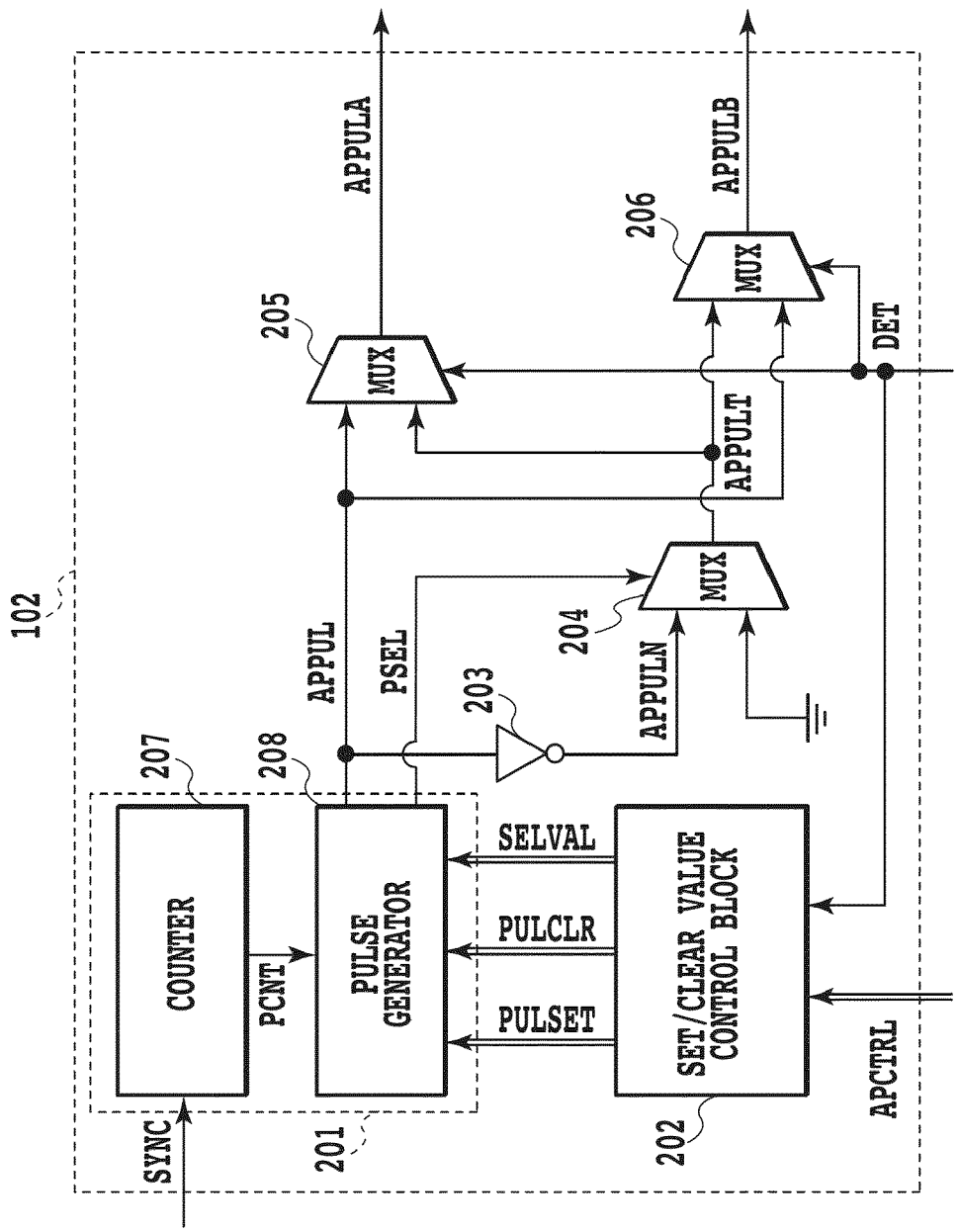
FIGS. 10A and 10B show block diagrams of an anti pop-noise pulse generator shown in FIG. 9.
Figure 10B:
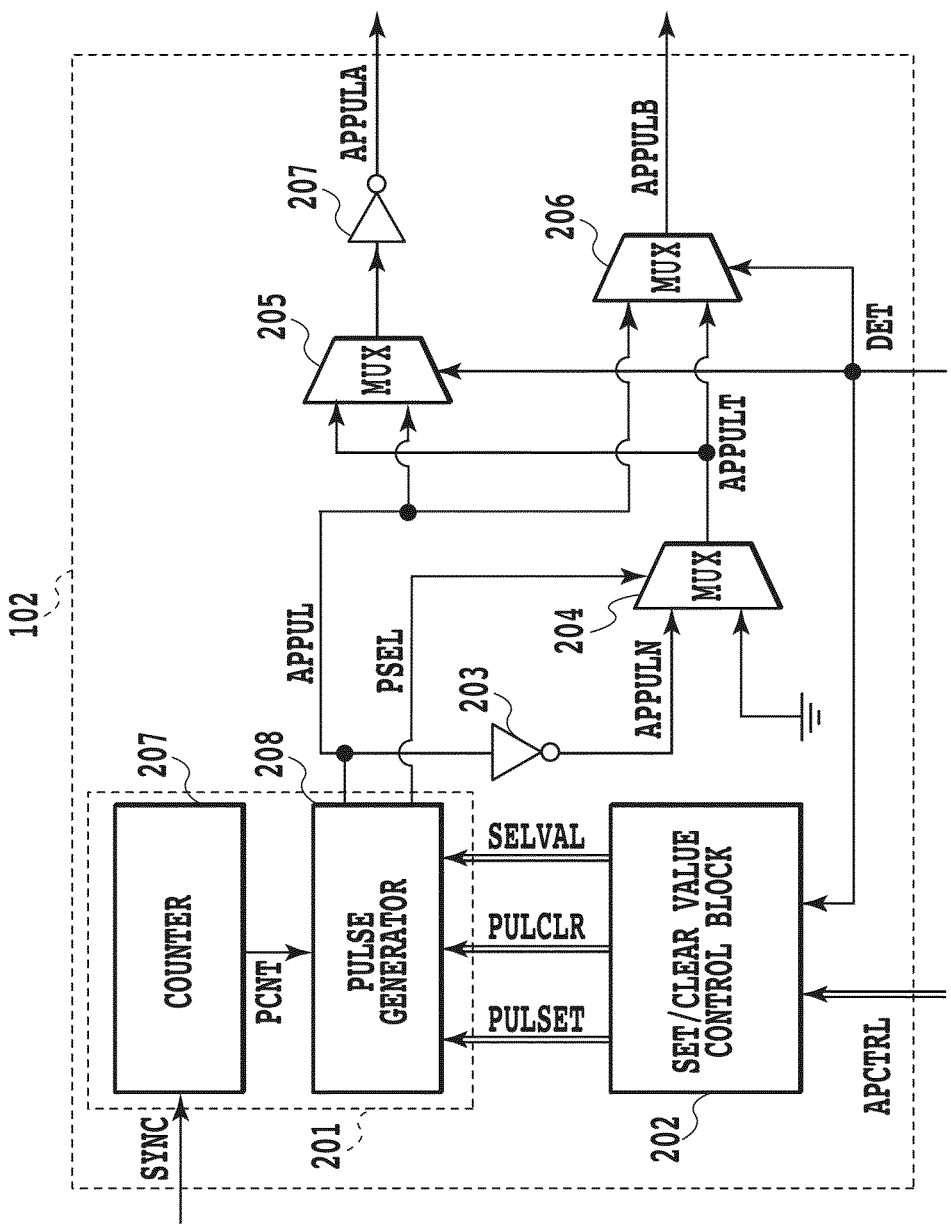

FIGS. 10A and 10B show two different block diagrams of the anti pop-noise pulse generator 102. Which one of them is to be used depends on which configuration of FIGS. 2A to 2C is used, for example, if only NMOS is used or NMOS and PMOS are used and which format of the output signals is used. Moreover, FIG. 11 shows a block diagram of the anti pop-noise control circuit 103.

Figure 11:
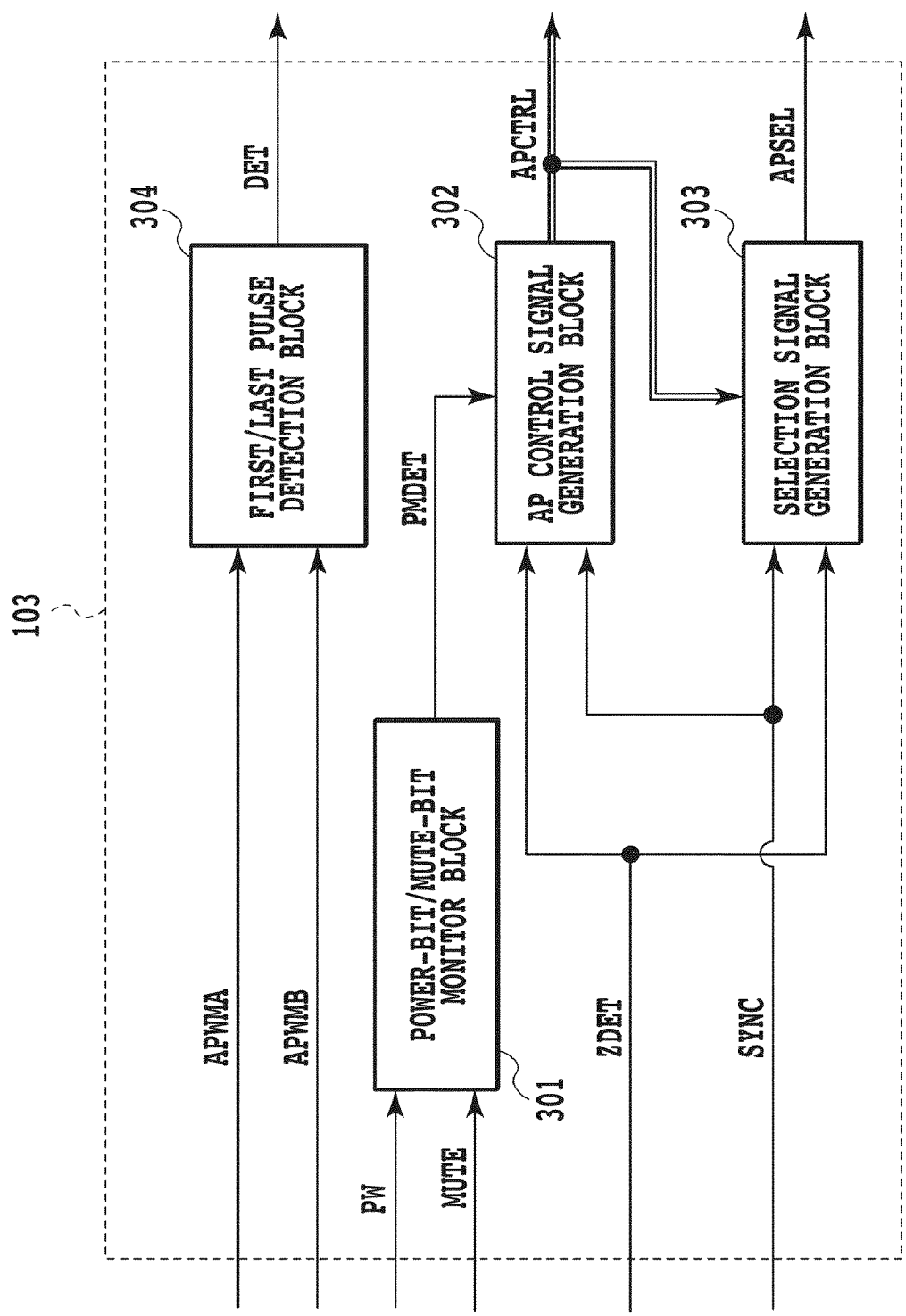
FIG. 11 shows a block diagram of an anti pop-noise control circuit shown in FIG. 9.

In FIG. 11, the anti pop-noise control circuit 103 generates a control signal APCTRL for generating reduced-width pulses and a control signal APSEL for selecting between the reduced-width pulses and the audio PWM signal.

This block includes: a power-bit/mute-bit monitor block 301 that receives a signal PW indicating the situation of indication of power-on and power-off and a signal MUTE indicating the situation of mute control so as to detect changes of the situations; a pulse detection block 304 that receives output signals APWMA and APWMB from the audio processor 101 so as to generate a signal DET for detecting on which signal the first or the last pulse is allocated; an AP control signal generation block 302 that generates a control signal APCTRL for generating reduced-width pulses; and a selection signal generation block 303 that generates a switch signal APSEL for switching the reduced-width pulses and the audio PWM signal.

The AP control signal generation block 302 and the selection signal generation block 303 receive a signal ZDET from the zero-detection circuit 104, a signal PMDET from the power-bit/mute-bit monitor block 301, and an output signal SYNC from the audio processor 101. Furthermore, the selection signal generation block 303 receives the control signal APCTRL from the AP control signal generation block 302 so as to generate the switch signal APSEL.

Here, the first pulse is a pulse of the differential PWM signal of the audio processor 101 following the pulses from the anti pop-noise pulse generator 102, and indicates a stable signal pulse (i.e.; 50% duty cycle pulse). Moreover, the last pulse is a pulse of the differential PWM signal of the audio processor 101, after which the pulses from the anti pop-noise pulse generator 102 will follow, and indicates a stable signal pulse (i.e.; 50% duty cycle pulse).

Moreover, the signal DET output from the pulse detection block 304 is a signal for determining to which one of two differential signals to generate the first pre-pulse, and from another viewpoint, it is also a signal to be used for synchronizing the phase relation between the generated pre-pulse and the output of the audio processor 101. The output signal DET of the pulse detection block 304 will determine to which one of two differential signals to generate the first pulse from the anti pop-noise pulse generator 102.

In FIG. 10A, the anti pop-noise pulse generator 102 receives the signal APCTRL and the signal DET from the anti pop-noise control circuit 103 and the signal SYNC from the audio processor 101. The signal APCTRL and the signal DET control a Set/Clear value control block 202.

The Set/Clear value control block 202 controls the pulse generator 201, which finally generates a plurality of reduced-width pulses by using both of an inverter 203 and a multiplexer 204.

The pulse generator 201 includes: a counter 207 for counting the signals SYNC; and a generator 208 for outputting signals APPUL and PSEL from a signal PCNT that is the counted result from the counter 207, and signals PULSET, PULCLR and SELVAL from the Set/Clear value control block 202.

Multiplexers 205 and 206 are added to switch the two pulse signals if needed. This depends on which one of APWMA and APWMB has the first pulse at power-on/un-mute or the last pulse at power-off/mute.

In comparison with FIG. 10A, FIG. 10B includes an inverter 209 added to the output of the multiplexer 205. When the anti pop-noise pulse generator 102 in FIG. 10A is used, the PWM signals are represented by FIGS. 12A to 21A described later, and when the anti pop-noise pulse generator 102 in FIG. 10B is used, the PWM signals are represented by FIGS. 12B to 21B described later.

Next, the signal APSEL output from the anti pop-noise control circuit 103 will be described. The signal APSEL controls the multiplexers 105 and 106 in FIG. 9 so as to determine which one should be finally output out of the output of the audio processor 101 and the pre-pulses of the anti pop-noise pulse generator 102. Generally, immediately after power-on and after power-off, the signal controls the multiplexers 105 and 106 so as to output the pre-pulses. Generally, at mute, it also controls them so as to output the pre-pulses.

However, as understood, the timing of controlling the multiplexers 105 and 106 so as to output the output of the audio processor 101 is when the PMDET-bit indicates that the power is on or the system is not in a mute situation, and after the pre-pulses are output and the zero-output of the audio processor 101 is detected. On the contrary, the timing of controlling the multiplexers 105 and 106 so as to output the pre-pulses is when the PMDET-bit indicates that the power is off or the system is in a mute situation, and after the signal ZDET is received.

Of course, immediately after the actual power-off, the system is controlled by the anti pop-noise control circuit 103 so that the pulse output of the anti pop-noise pulse generator 102 becomes in a no-signal situation by the initial setting at power-on. After that, the power-on situation is detected and control operation by the anti pop-noise control circuit will be started by the signal APCTRL generated from the signal PMDET.

Moreover, the anti pop-noise pulse generator 102 can output not only the so-called reduced-width pulses, but also the pulses the same as those of the stable signal output of the audio processor 101 and no signal. After outputting the reduced-width pulses after power-on and at un-mute, the generator outputs a differential signal of 50% duty cycle. On the other hand, at power-off/at mute after outputting the reduced-width pulses, it outputs no signal.

FIG. 23 shows examples of mutual relationship between a plurality of reduced-width pre-pulses. When three reduced-width pulses are generated as pre-pulses, the reduced-width pulses are output as indicated in FIGS. 23A and 23B as described using FIGS. 4A to 4D. FIGS. 23A and 23B show cases each having a different phase, where, the width of 50% duty cycle pulses is represented as 100%.

Form another viewpoint, when three reduced-width pulses are generated as pre-pulses, in case that a half period is represented as 100, their pulse widths are 27.8, 72.8 and 95.0, respectively (27.8+72.8+95.0=195.6). Thus, it is indicated that when the change point of the 50% duty cycle waveforms of the audio processor is set zero and its half period is set 100, a first pulse begins at a time point of 4.4 (=200−195.6); the first pulse finishes and a second pulse begins at a time point of 32.2 (=4.4+27.8); the second pulse finishes and a third pulse begins at a time point of 105.0 (=4.4+27.8+72.8); the third pulse finishes and a fourth pulse begins at a time point of 200; and the fourth pulse finishes at a time point of 300.

Here, it is indicated that in case of FIG. 23A the first and third pulses and the second pulse are allocated to PWMA and PWMB, respectively. FIG. 23C shows a case of a silent situation (of 50% duty cycle) represented in the same manner as for FIGS. 23A and 23B.

Figure 22:
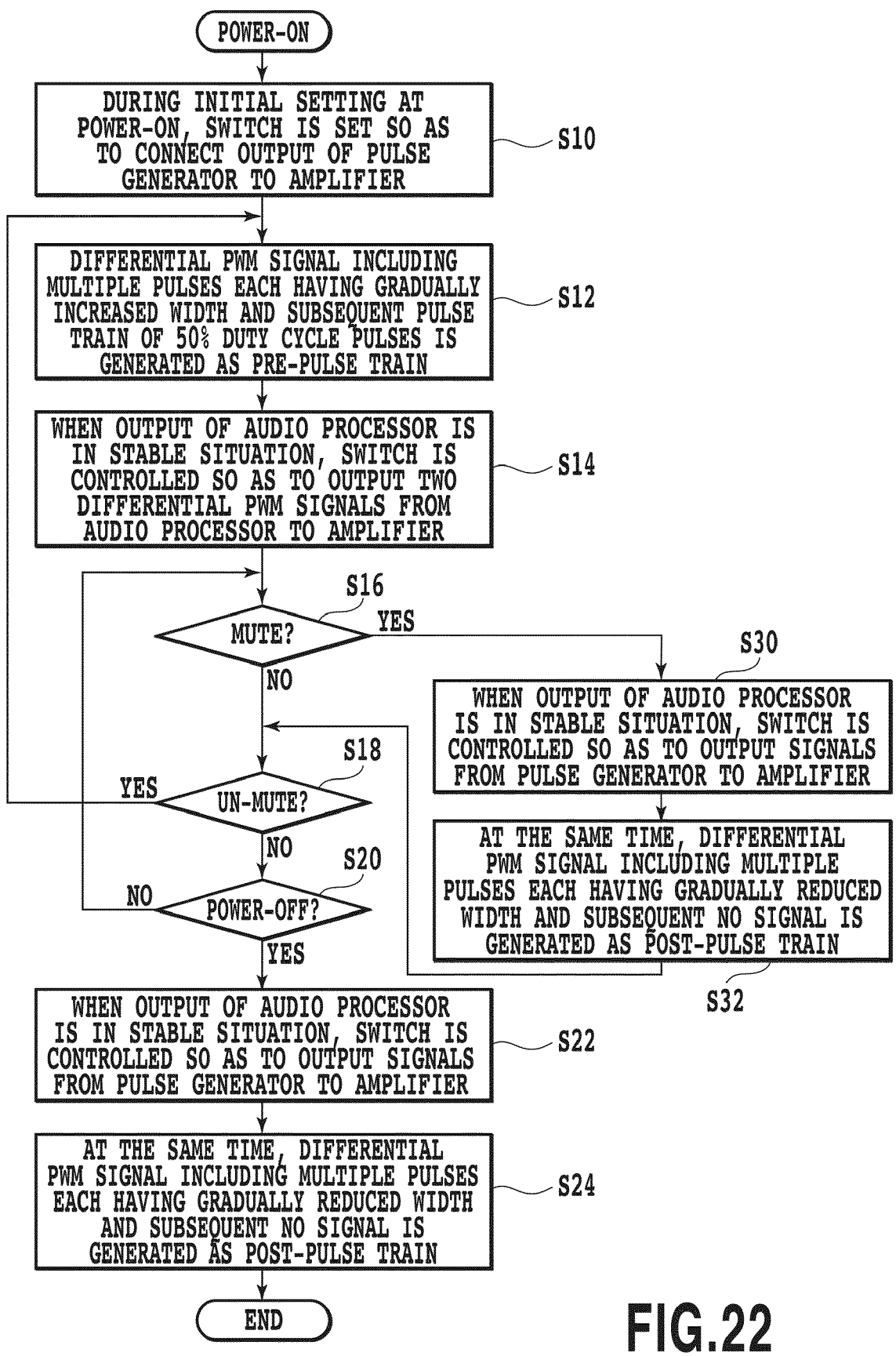
FIG. 22 is a flowchart showing a method according to the present invention.

FIG. 22 is a flowchart indicating how to control the above-described blocks. If a system including the class-D amplifier is powered-on, the system proceeds to step S10, where firstly the situation of the anti pop-noise control circuit 103 is set initially. Thereby, the circuit 103 is set such that in case of version 1, the anti pop-noise pulse generator 102 outputs no signal and the multiplexers 105 and 106 transmit the output of the anti pop-noise pulse generator 102 to the amplifier.

After that, the system proceeds to step S20, where according to the signal DET, the anti pop-noise control circuit 103 controls the anti pop-noise pulse generator 102 so as to generate a differential PWM signal including a plurality of pulses each having a gradually increased width and the subsequent pulse train of duty cycle 50% pulses. In this pulse train, the period of the plurality of pulses each having a gradually increased width is known in advance, because the operation mode is set in advance. For example, when the generator generates three reduced-width pulses as pre-pulses, after the start of generation, it completes the generation at a period $T_{sw}$, as mentioned above.

After a given number of reduced-width pulses are output, whether the output of the audio processor 101 is in a stable situation or not is detected by the signal ZDET. If the output is in a stable situation, that is the differential PWM signal after converted is in a situation of duty cycle of 50%, the multiplexers 105 and 106 will be controlled so as to switch the output to the amplifier from the output of the anti pop-noise pulse generator 102 to the output from the audio processor 101. After they are controlled, the system proceeds to step S16, where whether the switched output should be muted or not is checked, and if it should not be muted, the system proceeds to step S18, where whether the output should be un-muted or not is checked, and if it should not be un-muted, the system proceeds to step S20, where whether power-off control is needed or not is checked, and if it is not needed the system returns to step S16. Thus, normally, a normal loop (S16→S18→S20→S16) will be repeated.

If it is detected that the output should be muted (indicated that to make the output in a mute situation) at S16, the system proceeds to step S30, where firstly whether the output of the audio processor 101 is in a stable situation or not is checked. If it becomes in a stable situation, the audio processor 101 is controlled according to the signal DET so as to send the signal from the anti pop-noise pulse generator 102 to the amplifier. At S32, at the same time of S30, according to the signal DET, the anti pop-noise control circuit 103 controls the anti pop-noise pulse generator 102 so as to output a differential PWM signal including a plurality of pulses each having gradually reduced width and the subsequent no signal. After that, the system returns to the above-described normal loop. Subsequently, the multiplexers 105 and 106 will continue to send the output (no signal in this case) of the anti pop-noise pulse generator 102 to the amplifier until control of un-mute is performed.

When receiving an un-mute instruction, the system returns to step S12 and performs the steps S12 and S14 in the similar manner to the case at power-on. Here, when the system returns to step S12 in reception of the un-mute instruction, since multiplexers 105 and 106 already sent the output of the anti pop-noise pulse generator 102 to the amplifier, it is possible to immediately control the generator 102 so as to generate pre-pulses.

If at step S20, the system detects indication of power-off, it proceeds to step S22 and performs steps S22 and S24 in the similar manner to the case at mute, and then completes processing. Processing at step S22 and step S24 are the same as those of step S30 and step S32, respectively.

As above, a case where mute control is done as stopping of application of the PWM signal on the class-D amplifier is shown. In another way, the mute control can also be done by controlling the level of the audio signal. Accordingly, it is not always necessary to do the above-described mute control as stopping of application of the PWM signal on the class-D amplifier.

The above block diagram shows a general embodiment of the present invention capable of corresponding to various cases. For example, modification where the first and the last pulses are fixed to either one of them in advance, can also be supposed.

It should be understood that there are two or three reduced-width pulses in the below described embodiments. As described before, using Formulas 1 to 3, widths of more reduced-width pulses can be calculated. The below described embodiment can also be easily applied to a case having more reduced-width pulses. In this description, when referred to as "reduced-width pulses", they are used for pulses of the differential signal (PWMA, PWMB).

FIGS. 12 to 21 show timing diagrams in embodiments. Here, FIGS. 12 to 16 and FIGS. 17 to 21 show situations where at no signal, both of PWMA and PWMB turn off transistors of the amplifier.

Hereinafter, with regard to FIGS. 12 to 21, the number of the reduced-width pulses, and classification of start-up (power-on), un-mute, shut-down (power-off) and mute are represented in a table.

TABLE 2

Figure 12:
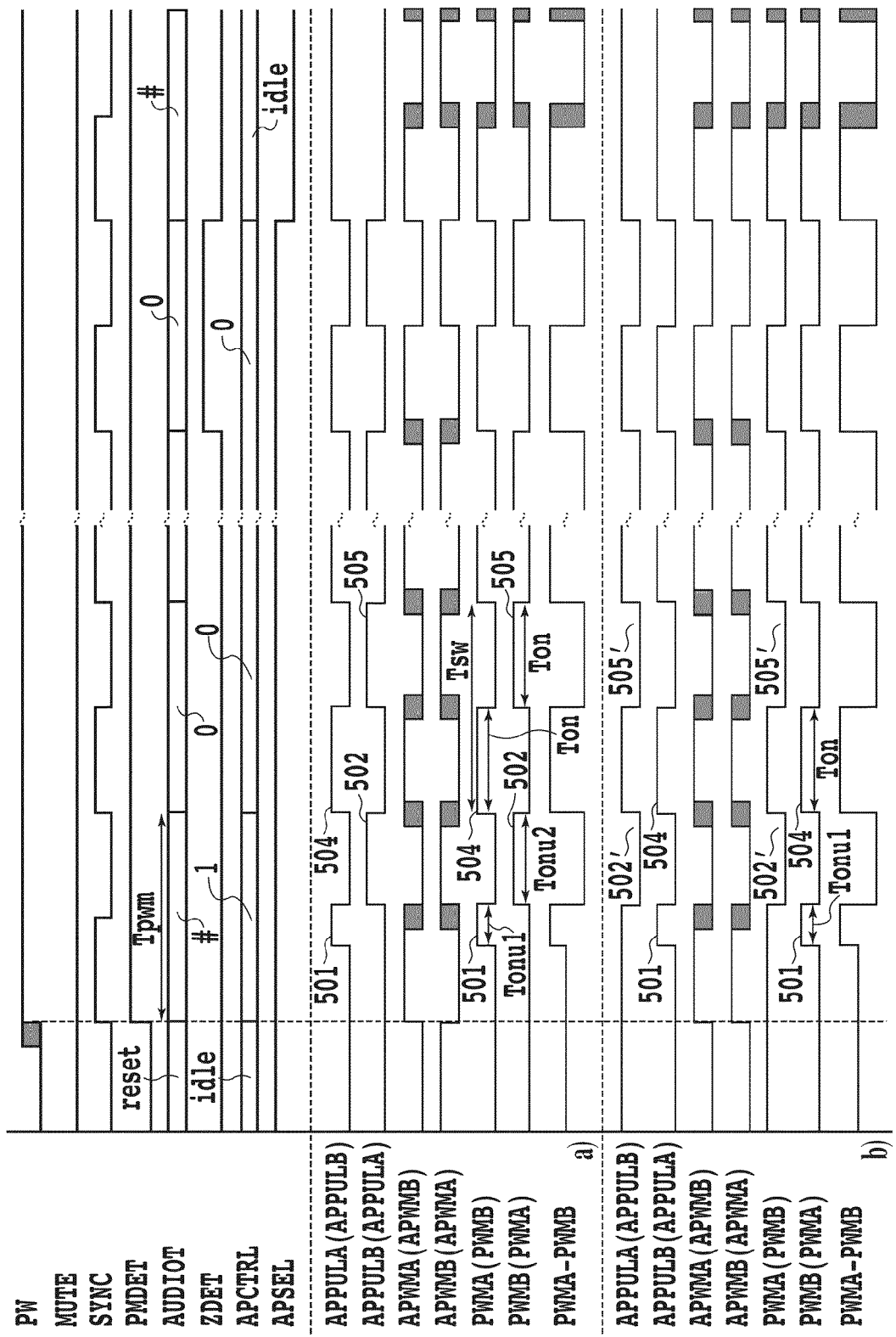
FIG. 12 shows version 1 of a timing diagram of PWM signals at start-up with two reduced-width pulses.
Figure 13:
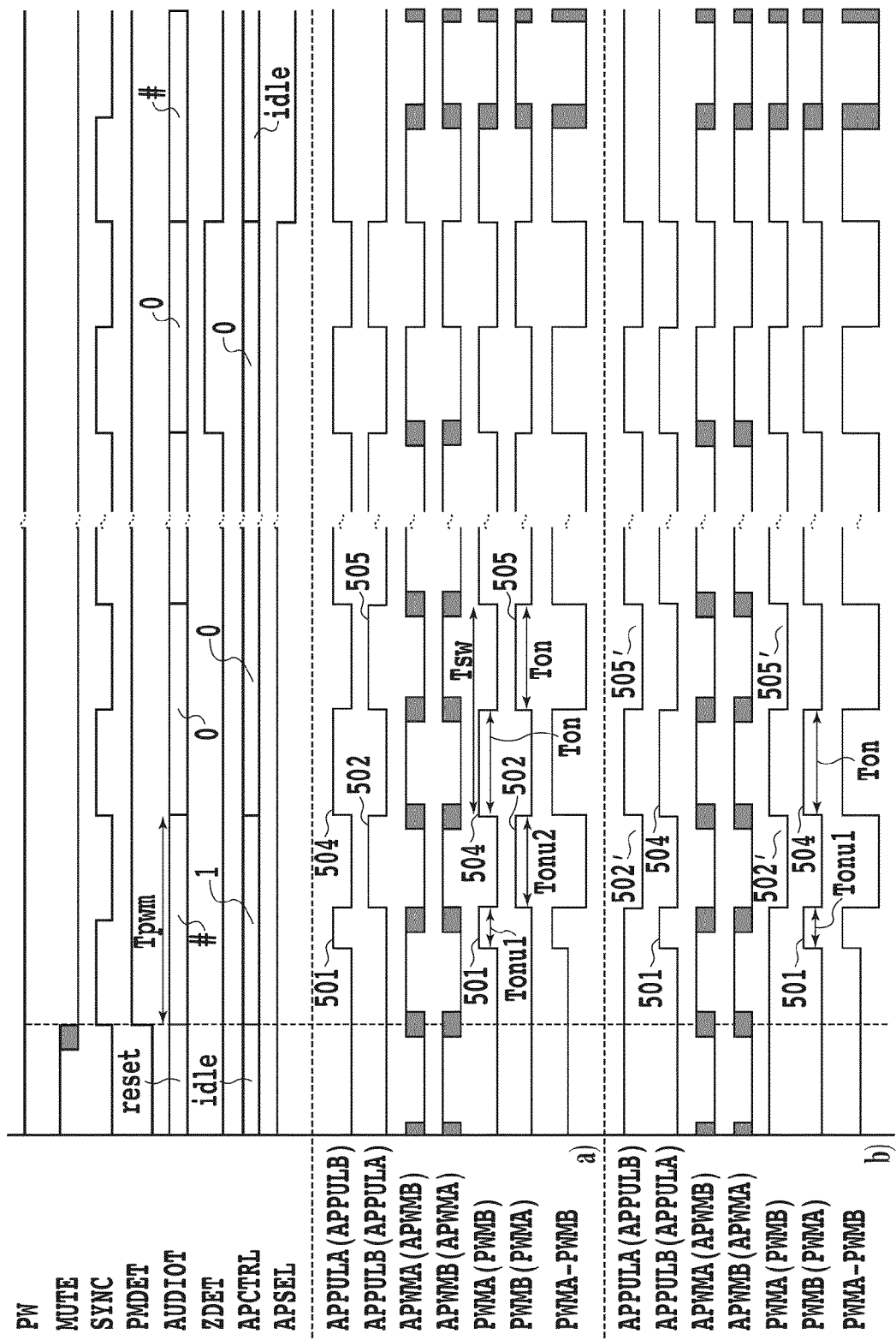
FIG. 13 shows version 1 of a timing diagram of PWM signals at un-muting with two reduced-width pulses.
Figure 14:
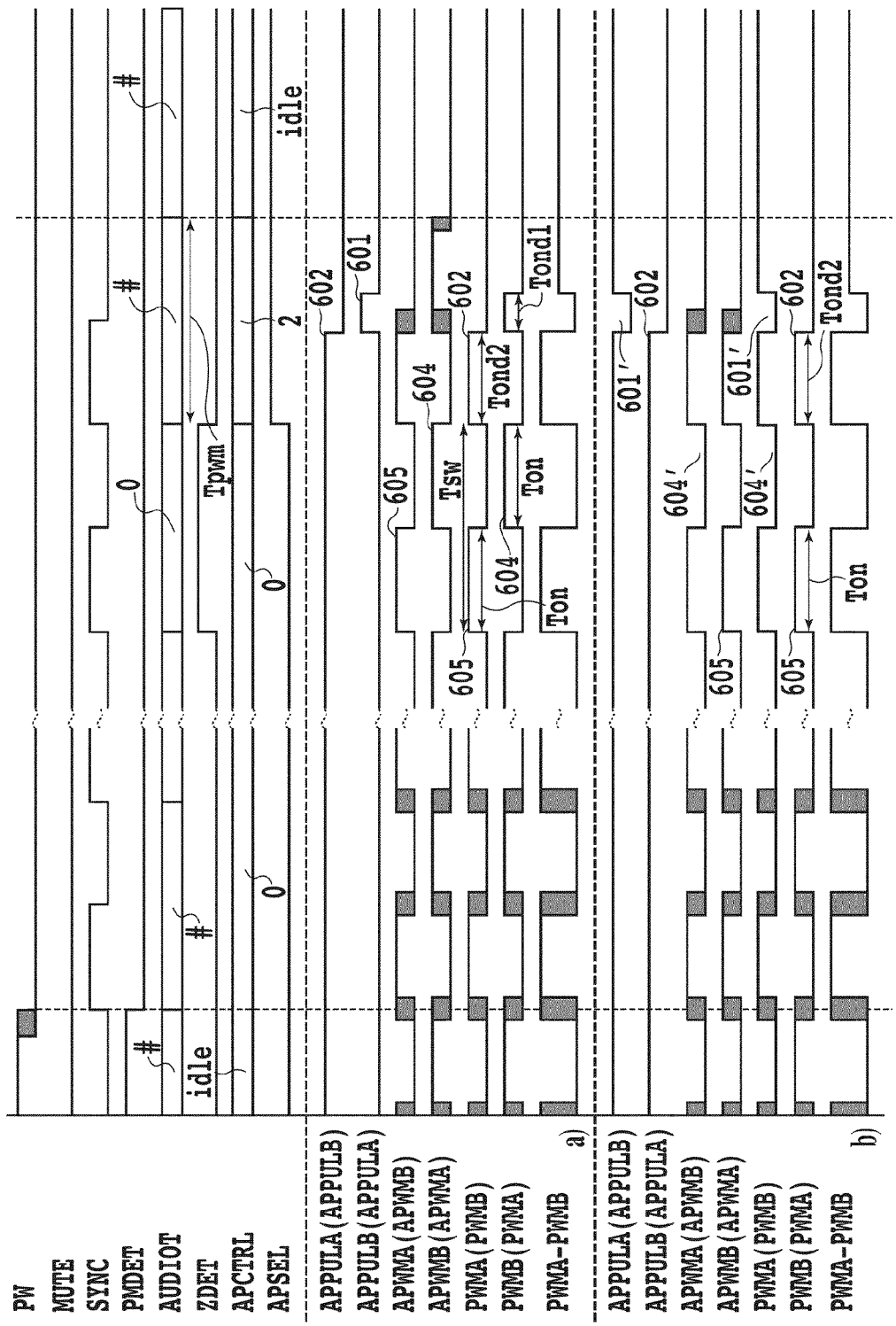
FIG. 14 shows version 1 of a timing diagram of PWM signals at shut-down with two reduced-width pulses.
Figure 15:
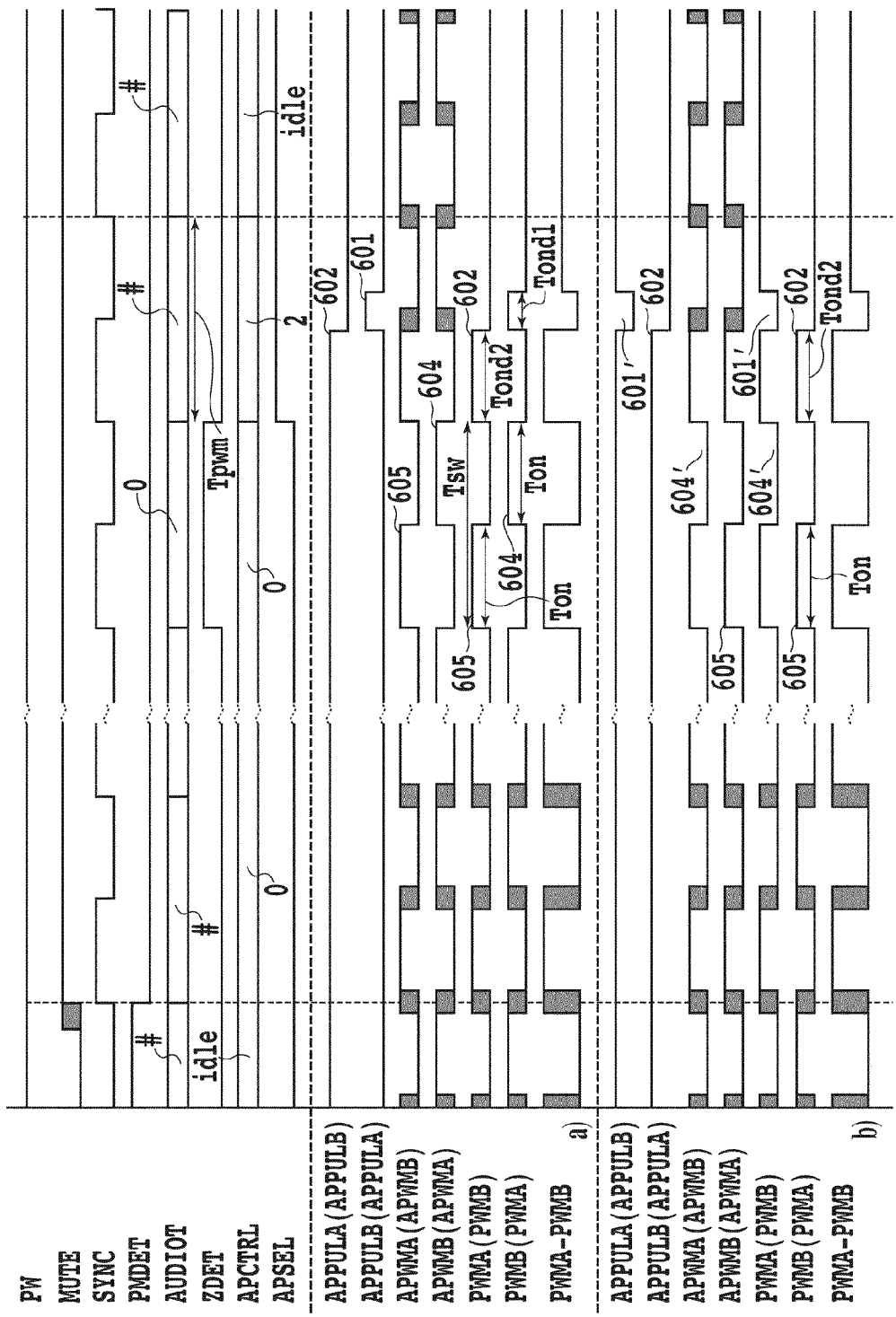
FIG. 15 shows version 1 of a timing diagram of PWM signals at muting with two reduced-width pulses.
Figure 16:
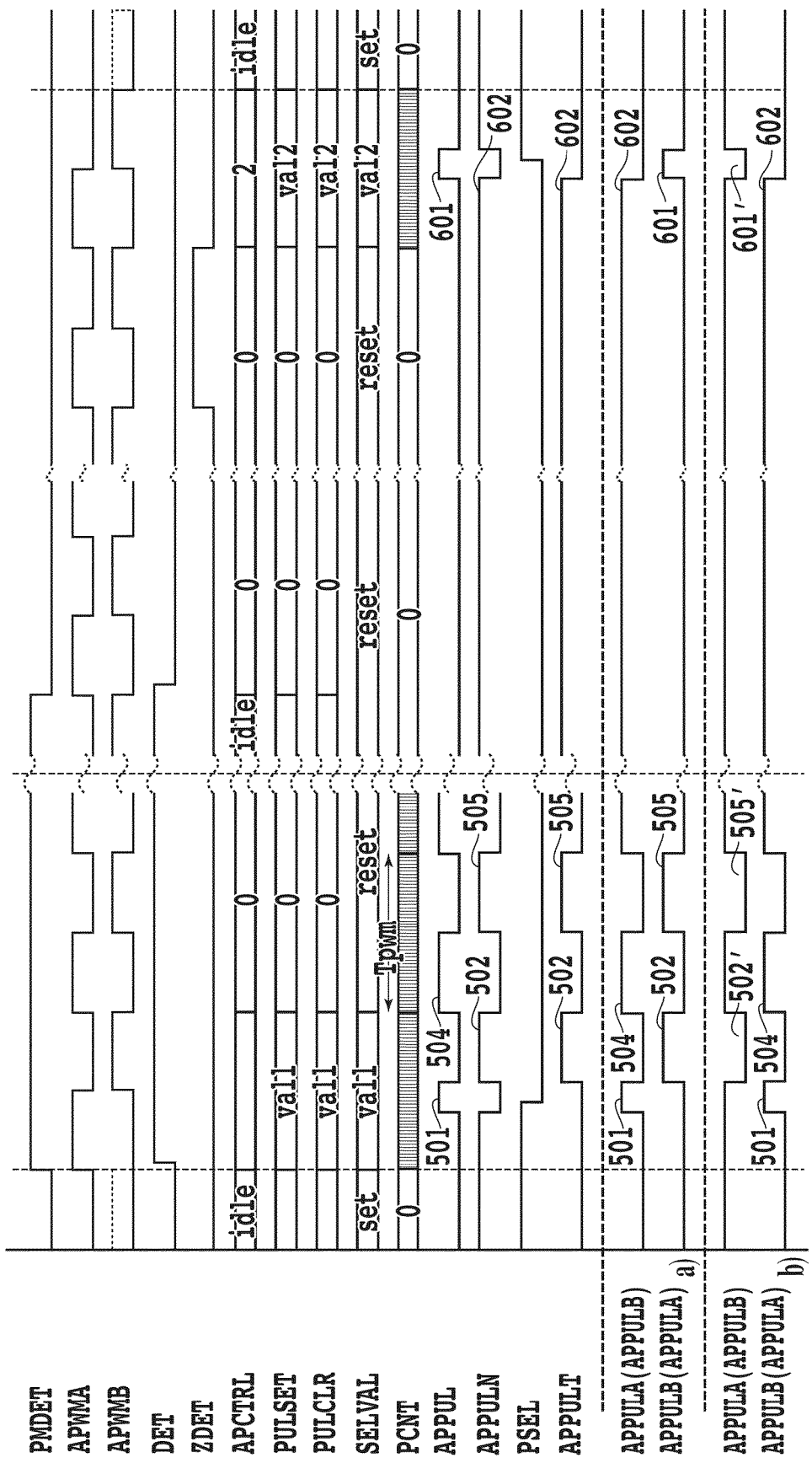
FIG. 16 shows version 1 of a timing diagram for the generation of two reduced-width pulses.
Figure 17:
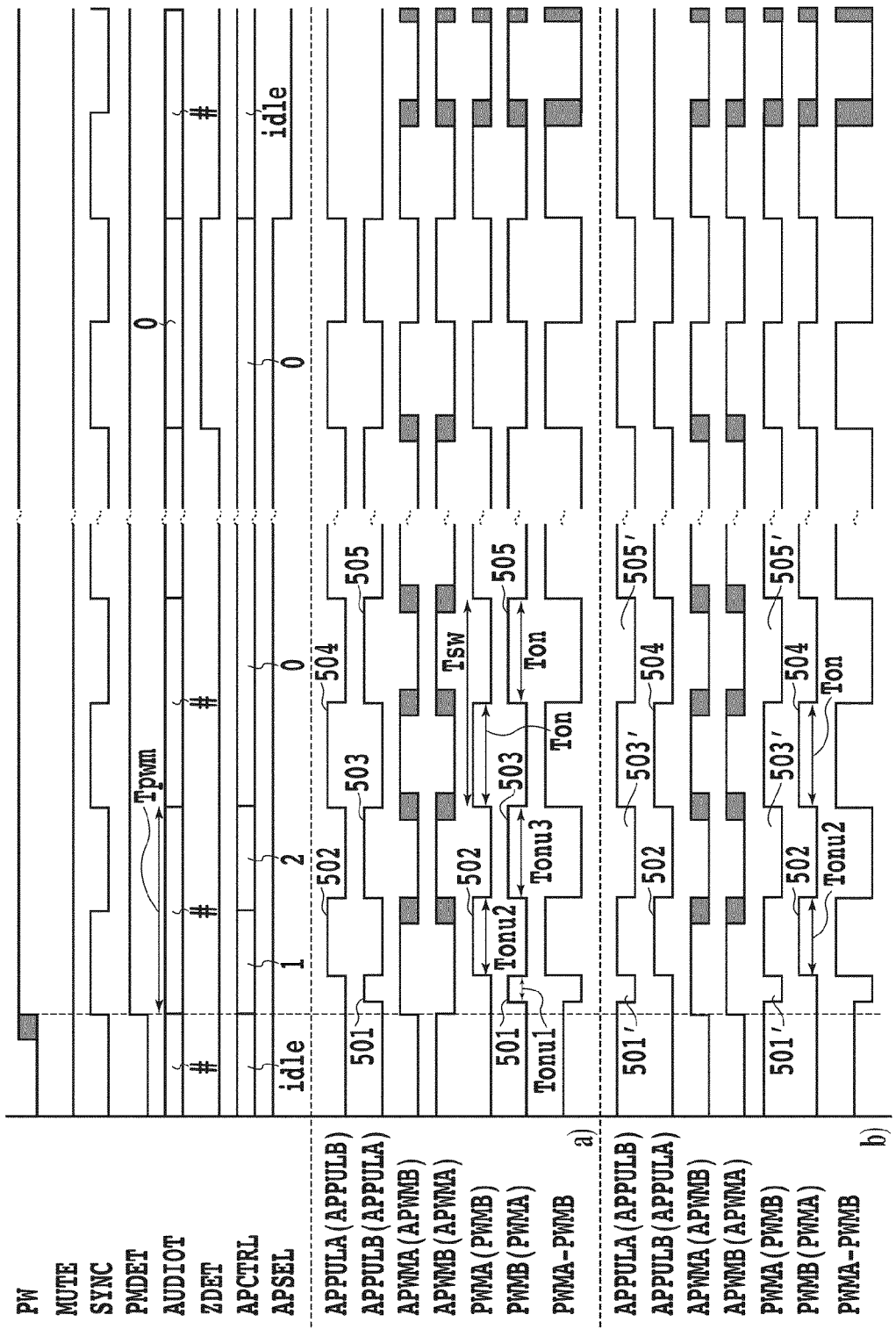
FIG. 17 shows version 1 of a timing diagram of PWM signals at start-up with three reduced-width pulses.
Figure 18:
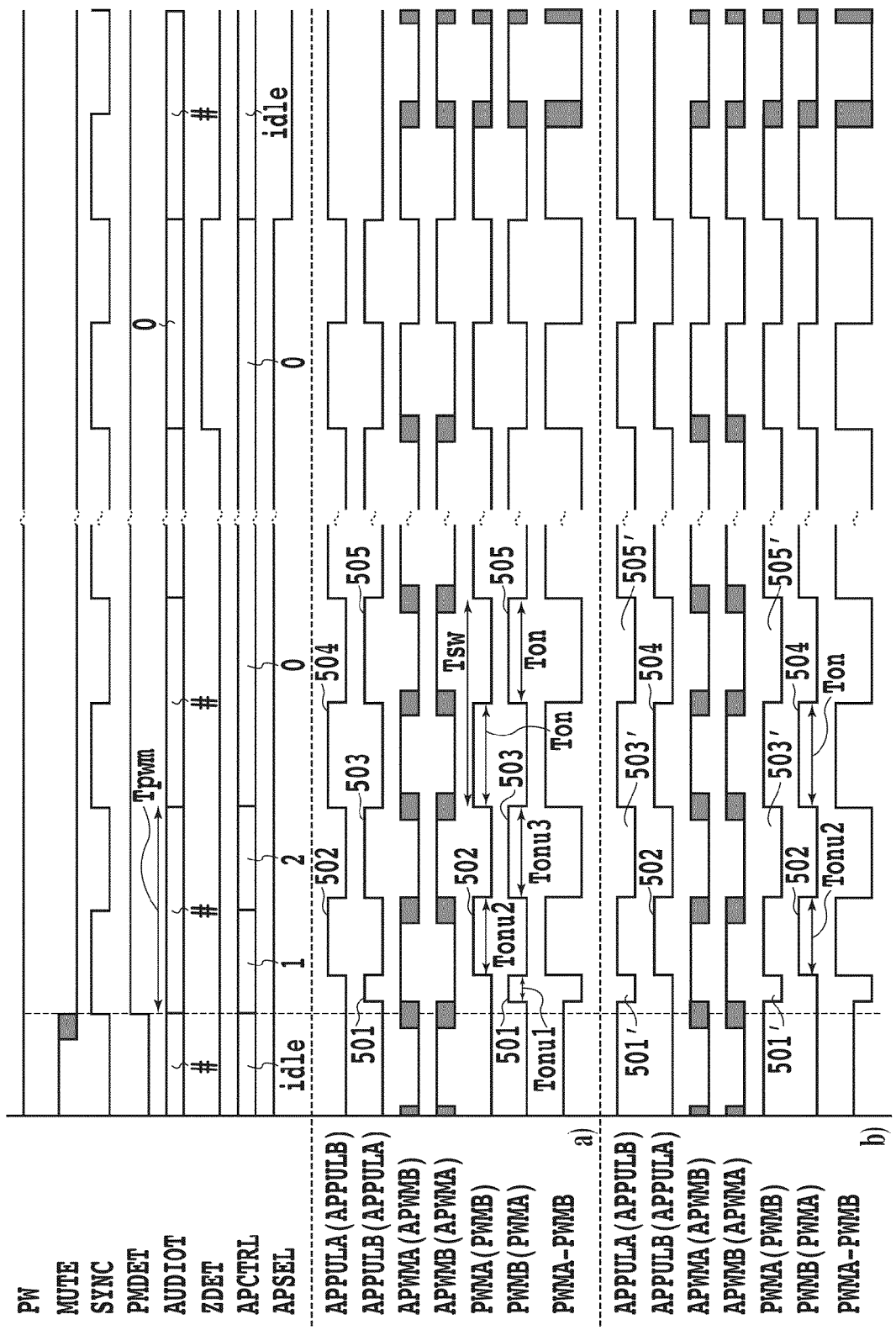
FIG. 18 shows version 1 of a timing diagram of PWM signals at un-muting with three reduced-width pulses.
Figure 19:
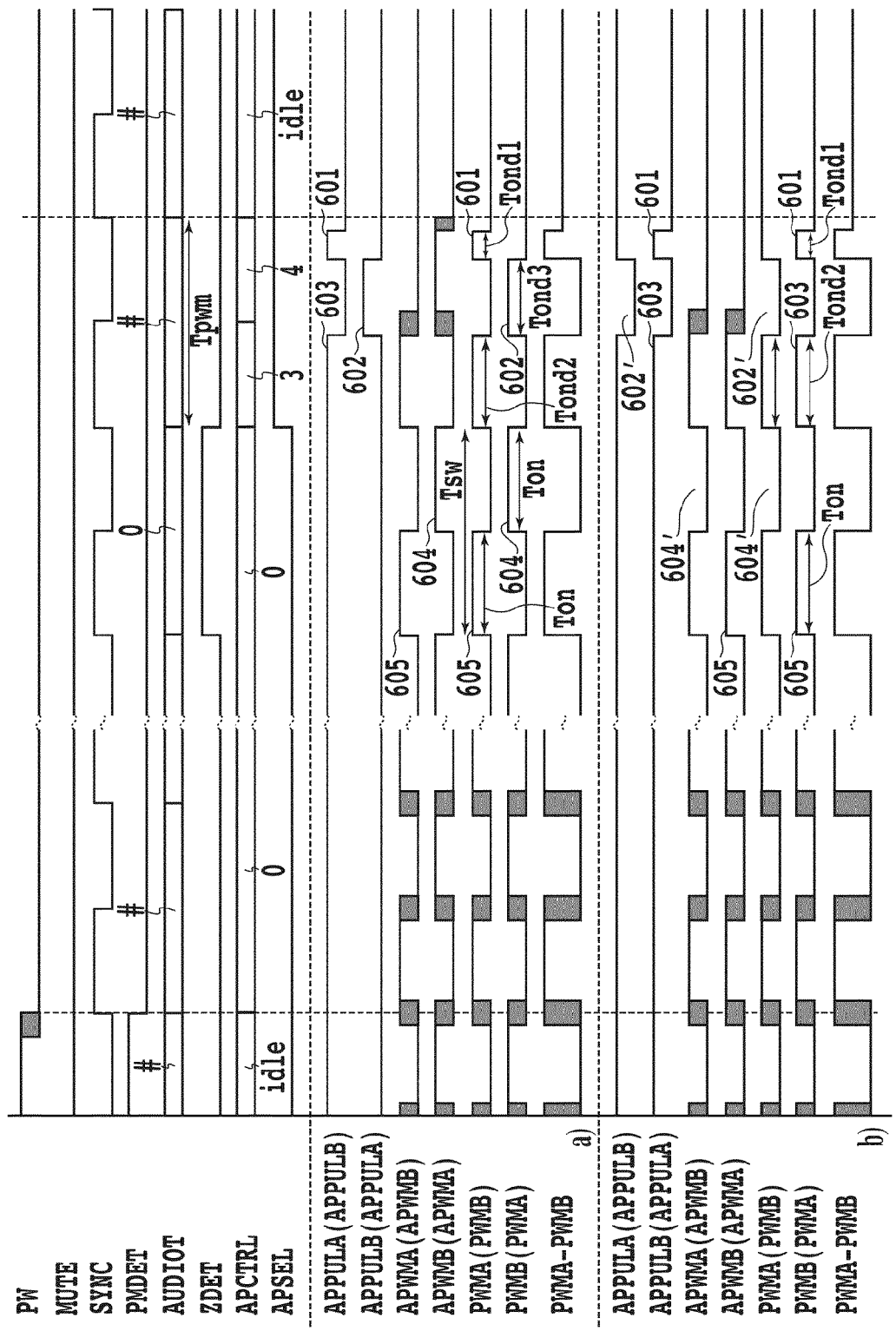
FIG. 19 shows version 1 of a timing diagram of PWM signals at shutdown with three reduced-width pulses.
Figure 20:
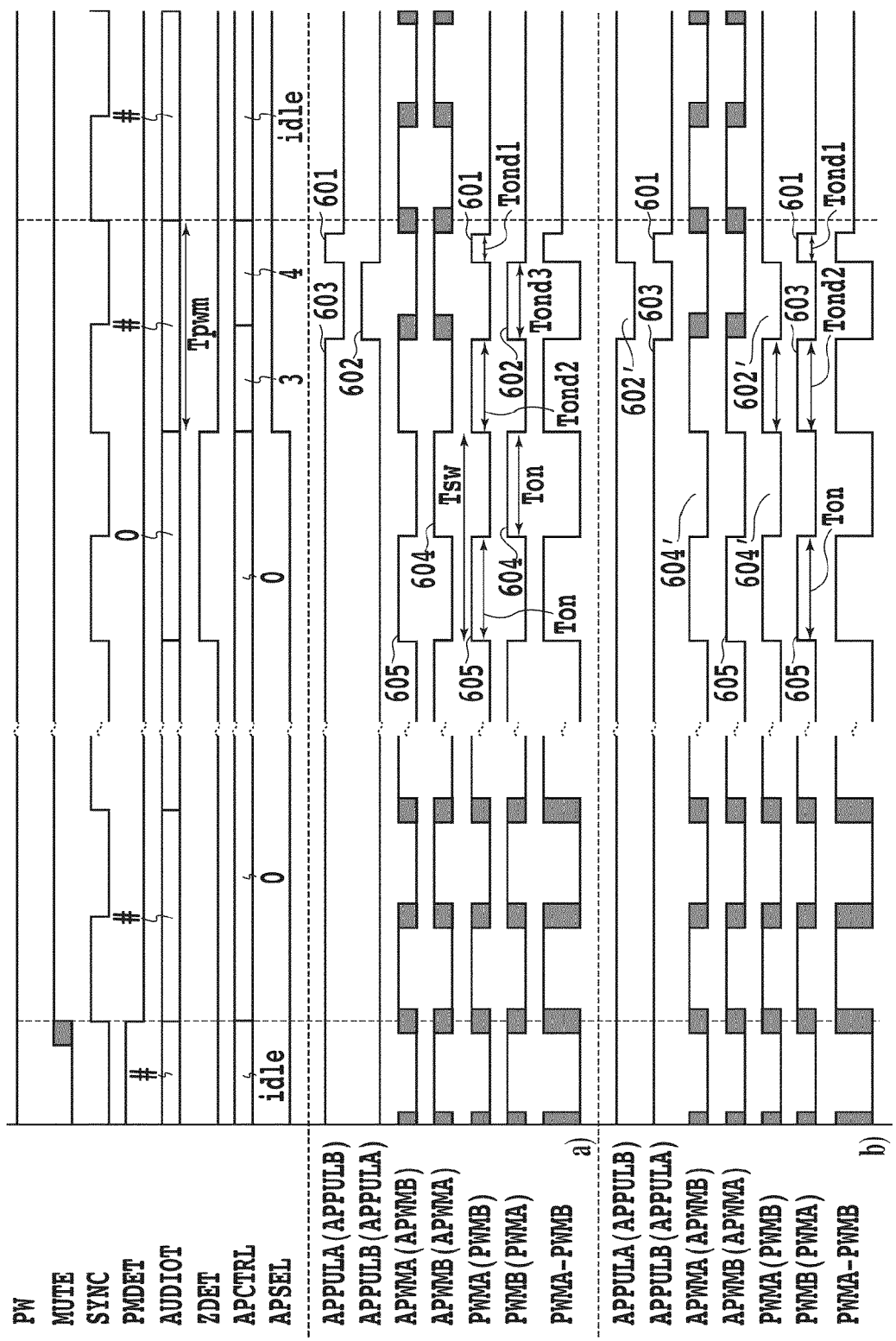
FIG. 20 shows version 1 of a timing diagram of PWM signals at muting with three reduced-width pulses.
Figure 21:
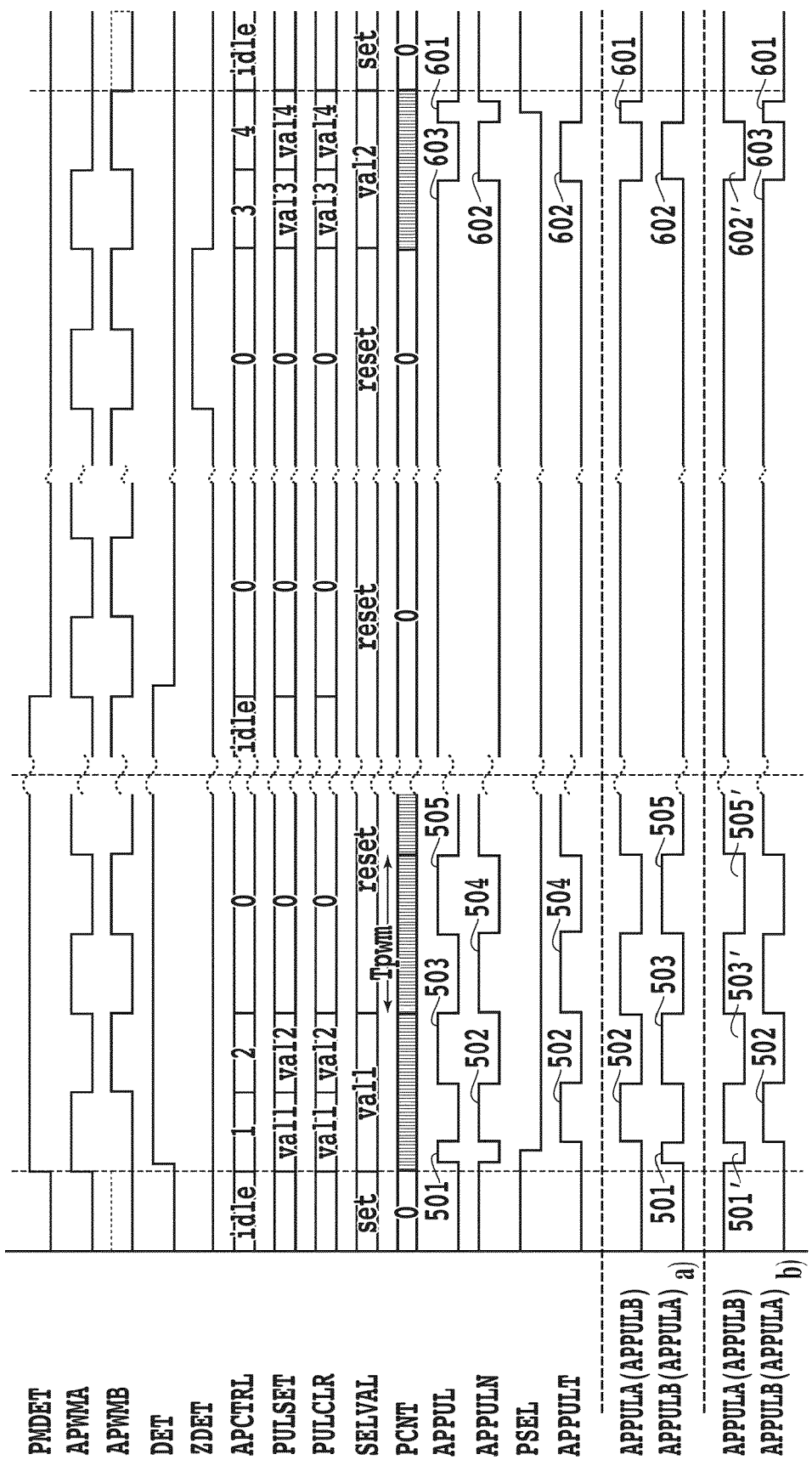
FIG. 21 shows version 1 of a timing diagram for the generation of three reduced-width pulses.

| FIG. No. | number of the reduced-width pulses | |
|---|---|---|
| FIG. 12 | 2 | start-up |
| FIG. 13 | 2 | un-mute |
| FIG. 14 | 2 | shut-down |
| FIG. 15 | 2 | mute |
| FIG. 16 | 2 | |
| FIG. 17 | 3 | start-up |
| FIG. 18 | 3 | un-mute |
| FIG. 19 | 3 | shut-down |
| FIG. 20 | 3 | mute |
| FIG. 21 | 3 | |

FIGS. 12 and 17 show two different power-up situations, where a) shows the signals PWMA and PWMB when both of the transistors M1 and M2 in FIGS. 2A and 2B are NMOS, and b) shows the signals PWMA and PWMB when the transistors M1 and M2 in FIGS. 2A and 2B are PMOS and NMOS, respectively.

FIGS. 13 and 18 show two different un-muting situations, where a) shows the signals PWMA and PWMB when both of the transistors M1 and M2 in FIGS. 2A and 2B are NMOS, and b) shows the signals PWMA and PWMB when the transistors M1 and M2 in FIGS. 2A and 2B are PMOS and NMOS, respectively. FIG. 12 shows the power-up situation using two reduced-width pulses. FIG. 17 shows the power-up situation using three reduced-width pulses.

FIG. 13 shows the un-muting situation using two reduced-width pulses. FIG. 18 shows the un-muting situation using three reduced-width pulses. All these situations will trigger the same response.

When the MUTE signal is in an un-mute situation and a transition from power-off to power-on on the power bit (PW) is detected, or when the power bit (PW) is in the power-on situation and a transition from mute to un-mute on the MUTE signal is detected, on the rising edge of the signal SYNC, PMDET bit indicates that the power is on or the system is not in a mute situation. The control signal APCTRL will control the Set/Clear value control block 202.

At this time point, APSEL is set at initial setting at power-on so as to output the output of the anti pop-noise pulse generator 102 to the amplifier, or at muting, APSEL is set so as to output the output of the anti pop-noise pulse generator 102 to the amplifier. Accordingly, regardless of whether or not the output of the audio processor 101 is in a stable situation, at this time point, the system will start sequence of generating a plurality of reduced-width pulses each having gradually increased width. After several reduced-width pulses are generated, a plurality of pulses having 50% duty cycle continues to be generated until the stable audio signal AUDIOT from the audio processor 101 is detected by the zero detection circuit 104. This zero detection is indicated by the signal ZDET. At the next rising edge of the signal SYNC, the signal APSEL switches signals from the reduced-width pulse signals APPULA and APPULB to the audio PWM signals APWMA and APWMB, which are output as the output signals PWMA and PWMB. In this case, more correctly speaking, in the switching, phase matching is carried out so that the first switched audio signal becomes the zero-detected audio signal.

FIGS. 14 and 19 show two different power-off situations, where a) shows the signals PWMA and PWMB when both of the transistors M1 and M2 in FIGS. 2A and 2B are NMOS, and b) shows the signals PWMA and PWMB when the transistors M1 and M2 in FIGS. 2A and 2B are PMOS and NMOS, respectively.

FIGS. 15 and 20 show two different muting situations, where a) shows the signals PWMA and PWMB when both of the transistors M1 and M2 in FIGS. 2A and 2B are NMOS, and b) shows the signals PWMA and PWMB when the transistors M1 and M2 in FIGS. 2A and 2B are PMOS and NMOS, respectively.

FIG. 14 shows the power-off situation using two reduced-width pulses. FIG. 19 shows the power-off situation using three reduced-width pulses.

FIG. 15 shows the muting situation using two reduced-width pulses. FIG. 20 shows the muting situation using three reduced-width pulses. All these situations will trigger the same response.

When the MUTE signal is in the un-mute situation and a transition from power-on to power-off on the power bit (PW) is detected or when the power bit (PW) is in the power-on situation and a transition from un-mute to mute on the MUTE signal is detected on the rising edge of the signal SYNC, PMDET bit indicates that the power is off or the system enters a mute situation. At this time point, the output of the audio processor 101 is sent to the amplifier. Therefore, it is important for advancing control whether or not the output of the audio processor 101 is in a stable situation. The system waits until a stable audio signal AUDIOT from the Audio Processor 101 is detected by the zero detection circuit 104, that is the converted differential PWM signal becomes a pulse train of 50% duty cycle pulses. This zero detection is indicated by the signal ZDET.

At the next rising edge of the signal SYNC, the signal APSEL switches signals from the audio PWM signals APWMA and APWMB to the reduced-width pulses signals APPULA and APPULB, which are output as output signals PWMA and PWMB and a sequence is initiated to generate the reduced-width pulses. After the reduced-width pulses are generated, no pulse is generated, and the system is in a no-signal situation, which continues until the system is in an un-mute situation or in a power-off situation, for example. The control signal APCTRL will control the Set/Clear value control block 202.

FIGS. 16 and 21 show timing diagrams of methods for generating reduced-width pulses for all cases mentioned before. For simplicity only the signals APPULA and APPULB are described when both of the transistors M1 and M2 in FIGS. 2A and 2B are NMOS.

These signals APPULA and APPULB are shown in FIG. 2A. In order to generate the signal for NMOS transistor only the APPULA signal has to be inverted all the time in comparison with using PMOS transistors, this is shown in FIG. 2B.

The left side shows the power-on/un-mute situation. When the transition to power-on/un-mute is detected by the signal PMDET, the control signal APCTRL is set to a certain value and the pulse generator 201 is started. By the control signals APCTRL, the signals PULSET and PULCLR are set. The signal PULSET indicates at what time the pulse on the signal APPUL rises. The signal PULCLR indicates at what time the pulse on the signal APPUL falls.

The first pulse 500 on the audio signal APWMA or APWMB is detected and indicated by the signal DET. The signal DET sets the multiplexers 205 and 206. At first the pulse signals APPULA and APPULB are independent from each other until the first reduced-width pulse 501 occurs. From time point when pulse 501 occurs, the pulse signals become versions inverted each other.

Therefore at first time point, the signal line, which will transmit the $2^{nd}$ reduced-width pulse 502, will be "L" in version 1 or "H" in version 2 until the $1^{st}$ reduced-width pulse 501 occurs. After this the signal line, which transmit the $2^{nd}$ reduced-width pulse 502, will be changed to the inverted version of the signal APPUL. The signal PSEL controls the multiplexer 204, which selects between the inverted signal APPUL and "L" or "H". The change time point on the signal PSEL is determined by the signal SELVAL. After the all reduced-width pulses occurred, the signal APCTRL is set to a value to generate a 50% duty cycle pulse signal on the signal APPUL.

The right sides of FIG. 16 and FIG. 21 show the power-off/mute situation. When the transition to power-off/mute is detected by the signal PMDET, the last pulse in the PWM timeframe (Tpwm) on the audio signal APWMA or APWMB is detected and indicated by the signal DET.

When a stable signal on the signal AUDIOT is indicated with the signal ZDET, the control signal APCTRL is set to a certain value and the pulse generator 201 is started. By the signal APCTRL, the signals PULSET and PULCLR are set. The signal PULSET indicates at what time the pulse on the signal APPUL rises. The signal PULCLR indicates at what time the pulse on the signal APPUL falls.

At first time point, the pulse signals APPULA and APPULB are versions inverted each other until the last reduced-width pulse 601 occurs. From that time point the pulse signals are independent from each other. Therefore at first time point, the signal line, which will transmit the $2^{nd}$ last reduced-width pulse 602, will be the inverted version of the signal APPUL until the last reduced-width pulse 601 occurs.

After this the signal line, which transmits the $2^{nd}$ last reduced-width pulse 602, will be changed to "L" in version 1 and "H" in version 2. The signal PSEL controls the multiplexer 204, which selects between the inverted signal APPUL and "L" or "H". The change point on the signal PSEL is determined by the signal SELVAL.

Although the present invention has been described herein with reference to the accompanying drawings, it is to be understood that the present invention is not limited to those precise embodiments, and various other changes and modifications may be affected therein by one skilled in the art without departing from the scope and spirit of the invention. All such changes and modifications are intended to be included within the scope of the invention as defined by the appended claims.

While the present invention has been discussed with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A PWM signal generation circuit for generating a differential PWM signal composed of a first and a second PWM signal to be output to a class-D amplifier, comprising:

a pulse generator for outputting a differential PWM signal including a plurality of pulses each having a gradually increased or reduced width at power-on/power-off or at mute/un-mute, wherein said plurality of pulses each having a gradually increased width is alternately allocated to said first and second PWM signals in an ascending order of the widths, or said plurality of pulses each having a gradually reduced width is alternately allocated to said first and second PWM signals in an descending order of the widths.

2. The PWM signal generation circuit according to claim 1, wherein the ratios of widths of said plurality of pulses output from said pulse generator, each pulse having a gradually increased or reduced width except for the 50% duty cycle pulses may be calculated with the equations from Formula 1, Formula 2 and Formula 3:

$$eq_0 \Rightarrow T_i = T_{(i-1)} + \frac{T_{sw}}{2} \quad \text{Formula 1}$$

For $j$ = odd  Formula 2

$$eq_j \Rightarrow \frac{T_i^j + 2\sum_{n=1}^{i-1}[(-1)^{(n+j)} \cdot (T_n - T_i)^j] + T_{i-1}^j + 2\sum_{n=1}^{i-2}[(-1)^{(n+j)} \cdot (T_n - T_{i-1})^j]}{j!} = 0$$

For $j$ = even $$eq_j \Rightarrow \frac{T_i^j + 2\sum_{n=1}^{i-1}[(-1)^{(n+j)} \cdot (T_n - T_i)^j]}{j!} = 0$$

$j = 1, 2, 3 \ldots$ $$R_{Wpi} = \frac{2(T_i - T_{i-1})}{T_{sw}} \quad \text{Formula 3}$$

where, when the width of the 50% duty cycle pulse is set to '1', $T_{sw}$ represents the period of the differential PWM signal: 'i' is a numerical value which is '0' at the first rising edge of a train of the gradually increased pulses, '1' at the next transition point, and '2' at the subsequent transition point; 'i−1' gives the number of reduced-width pulses; 'j' selects an equation for desired signal: if j=1 it gives a formula to calculate no offset in an integrated signal, j=2 it gives a formula to calculate no offset in a $2^{nd}$ order integrated signal, j=3 it gives a formula to calculate no offset in a $3^{rd}$ order integrated signal, and j=n it gives a formula to calculate no offset in an $n^{th}$ order integrated signal; and Rwpi (i=1, 2, . . . ) represents the ratio of each pulse width.

3. The PWM signal generation circuit according to claim 1, wherein the absolute value of a sum of widths of said plurality of pulses output from said pulse generator, each pulse having a gradually increased or reduced width except for the 50% duty cycle pulses, that is a sum of widths of pluses allocated to said first PWM signal and pluses allocated to said second PWM signal when the polarities of the both signals are inverted each other, is a half value of the width of a pulse train of said 50% duty cycle pulses.

4. The PWM signal generation circuit according to claim 1, wherein if the number of said plurality of pulses output from said pulse generator, each pulse having a gradually increased or reduced width except for the 50% duty cycle pulses, is two, the difference in pulse widths between the first pulse allocated to said first PWM signal and the second pulse allocated to said second PWM signal is one-half of the width of the pulse train of said 50% duty cycle pulses.

5. The PWM signal generation circuit according to claims 1, wherein said pulse generator outputs a differential PWM signal including said plurality of pulses each pulse having a gradually increased or reduced width and the subsequent pulse train of 50% duty cycle pulses, or outputs a differential PWM signal including said plurality of pulses each pulse having a gradually increased or reduced width and the subsequent no signal.

6. The PWM signal generation circuit according to claim 5, further comprising:

a detection circuit for detecting that a differential PWM signal representing an audio input signal shows the same pulse train of 50% duty cycle pulses as said pulse train of 50% duty cycle pulses; and a multiplexer for receiving the differential PWM signal output from said pulse generator and the differential PWM signal representing said audio signal, and selecting one of the signals to output it to said class-D amplifier.

7. The PWM signal generation circuit according to claim 6, further comprising:

a situation detection block for detecting a power-on/power-off situation or a mute/un-mute situation; and a control block for controlling said multiplexer and controlling generation of the differential PWM signal in said pulse generator, based on the output signals of said situation detection block and said detection circuit.

8. The PWM signal generation circuit according to claim 7, wherein said control block, when receiving an detection output of detecting a first situation indicating the power-on situation or the un-mute situation from said situation detection block, controls said pulse generator so as to generate a differential PWM signal including the plurality of pulses each pulse having a gradually increased or reduced width and the subsequent pulse train of 50% duty cycle pulses, and controls said multiplexer during outputting the pulse train of the 50% duty cycle pulses so as to switch the output of said multiplexer from the output of said pulse generator to the differential PWM signal representing said audio signal, based on the output of said detection circuit.

9. The PWM signal generation circuit according to claim 7, wherein said control block, when receiving an detection output of detecting a second situation indicating the power-off situation or the mute situation from said situation detection block, controls said multiplexer so as to switch the output of said multiplexer from the differential PWM signal representing said audio signal to the output of said pulse generator, and controls said first pulse generator so as to generate a differential PWM signal including the plurality of pulses each pulse having a gradually increased or reduced width and the subsequent no signal.

10. A class-D amplifier comprising a PWM signal generation circuit according to the claims 1.

11. A method for driving a class-D amplifier, comprising the steps of:
outputting a differential PWM signal including a plurality of pulses each pulse having a gradually increased or reduced width to said class-D amplifier at power-on/power-off or at mute/un-mute, said differential PWM signal having a first and a second PWM signal, and
allocating said plurality of pulses each having a gradually increased width to said first and second PWM signals alternately in ascending order of the widths, or allocating said plurality of pulses each having a gradually reduced width to said first and second PWM signals alternately in descending order of the widths.

12. The method according to claim 11, wherein
the ratios of widths of said plurality of pulses output from said pulse generator, each pulse having a gradually increased or reduced width except for the 50% duty cycle pulses can be calculated with the equations from Formula 1, Formula 2 and Formula 3:

$$eq_0 \Rightarrow T_i = T_{(i-1)} + \frac{T_{sw}}{2} \quad \text{Formula 1}$$

For $j$ = odd  Formula 2

$$eq_j \Rightarrow \frac{T_i^j + 2\sum_{n=1}^{i-1}[(-1)^{(n+j)} \cdot (T_n - T_i)^j] + T_{i-1}^j + 2\sum_{n=1}^{i-2}[(-1)^{(n+j)} \cdot (T_n - T_{i-1})^j]}{j!} = 0$$

For $j$ = even $$eq_j \Rightarrow \frac{T_i^j + 2\sum_{n=1}^{i-1}[(-1)^{(n+j)} \cdot (T_n - T_i)^j]}{j!} = 0$$

$j = 1, 2, 3 \ldots$ $$R_{Wpi} = \frac{2(T_i - T_{i-1})}{T_{sw}} \quad \text{Formula 3}$$

where, when the widths of the 50% duty cycle pulses are set to '1',
$T_{sw}$ represents the period of the differential PWM signal;
'i' is a numerical value which is '0' at a first rising edge of the gradually increased pulse train, '1' at the next transition point, and '2' at the subsequent transition point;
'i–1' gives the number of reduced-width pulses;
'j' selects an equation for desired signal: if j=1 it gives a formula to calculate no offset in an integrated signal, j=2 it gives a formula to calculate no offset in a $2^{nd}$ order integrated signal, j=3 it gives a formula to calculate no offset in a $3^{rd}$ order integrated signal, and j=n it gives a formula to calculate no offset in an $n^{th}$ order integrated signal; and Rwpi (i=1, 2, ...) represents the ratio of each pulse width.

13. The method according to claim 11, wherein
the absolute value of a sum of the widths of the plurality of pulses output from said pulse generator, each having a gradually increasing or decreasing width except for those of the 50% duty cycle pulses, that is a sum of the widths of the pulses allocated to said first PWM signal and the pulses allocated to said second PWM signal when the polarities of the both signals are inverted each other, may be one-half of the pulse width of the pulse train of said 50% duty cycle pulses.

14. The method for driving a class-D amplifier according to claim 11,
wherein if the number of said plurality of pulses output from said pulse generator, each pulse having a gradually increased or reduced width except for the 50% duty cycle pulses, is two, the difference in pulse widths between the first pulse allocated to said first PWM signal and the second pulse allocated to said second PWM signal is one-half of the width of the pulse train of said 50% duty cycle pulses.

* * * * *